US006633953B2

(12) United States Patent
Stark

(10) Patent No.: US 6,633,953 B2
(45) Date of Patent: Oct. 14, 2003

(54) RANGE CONTENT-ADDRESSABLE MEMORY

(75) Inventor: Moshe Stark, Even Yehuda (IL)

(73) Assignee: Hywire Ltd., Netanya (IL)

( * ) Notice: Subject to any disclaimer, the term of this patent is extended or adjusted under 35 U.S.C. 154(b) by 207 days.

(21) Appl. No.: 09/779,941

(22) Filed: Feb. 7, 2001

(65) Prior Publication Data

US 2002/0007446 A1 Jan. 17, 2002

Related U.S. Application Data

(60) Provisional application No. 60/181,110, filed on Feb. 8, 2000.

(51) Int. Cl.$^7$ .............................................. G06F 12/08
(52) U.S. Cl. ...................................... 711/108; 711/158
(58) Field of Search .................................. 711/108, 158

(56) References Cited

U.S. PATENT DOCUMENTS 5,920,886 A    7/1999    Feldmeier
6,237,061 B1    5/2001    Srinivasan et al.

OTHER PUBLICATIONS

B. Lampson et al. Proceedings of IEEE Inforcom, col. 3, pp. 1248–1256 (1998).
SiberCore Technologies. CIDR Implementation Using the SiberCAM Ultra–2M. AppNote: SCAN01, Feb. 2000.
SiberCore Technologies. "IP Packet Classification with SiberCAMs" AppNOTE: SCAN02. Apr. 2000.
SiberCAM Ultra–2M SCT 2000. www.sibercore.com.
A.J. McAuley et al. "Fast Routing Table Lookup Using CAMs". Proceedings of the Conference on Computer Communication (IEEE Inforcom), (San Francisco), vol. 3, pp. 1382–1391, Mar./Apr. 1993.

P. Grupta et al. "Routing Lookups in Hardware at Memory Access Speeds". Proc. Infocom, Apr. 1998, San Francisco.
Lara Technology, Inc. "Using the LT17010 SuperCam in 32–bit applications". http://www.laratech.com, 1999.
T.V. Lacshman et al. High Speed Policy–based Packet Forwarding using Efficient Multi–dimensional Range Matching. ACM SIGCOMM Conference 1998. Vancouver, B.C. Canada, pp. 203–214. (1998).
Lara Technology, Inc. "Internet Protocol Address Filtering". http://www.;aranetworks.com/products$_{13}$app$_{13}$notes.html, Application Note 005, Nov. 13, 2000.
LaraTechnology, Inc. :Longest Prefix Matching Using the LN17010 Search Engine. http://www.laranetworks,com/products$_{13}$app$_{13}$notes.html, Application Note 003, Nov. 6, 2000.
NetLogic Microsystems, Inc. "High Performance Layer 3 Forwarding". http://209.10.226.214/html/library/faqs/html. White Paper, 2000.

(List continued on next page.)

Primary Examiner—Reginald G. Bragdon
Assistant Examiner—Midys Inoa
(74) Attorney, Agent, or Firm—Mark M. Friedman

(57) ABSTRACT

A method and apparatus for storing an associative key data set of associative elements representing a range, and an associated data set of associated elements, such that an associative element is extracted from memory in response to an input key, the range being represented by a lower boundary value and/or an upper boundary value, the method including: a) providing first and second storage areas for storing the respective data sets; b) ordering the associative elements according to priority precedence; c) storage a boundary value of each associative element in the first storage area in a location corresponding to this order, and d) storing each associated data set value in the second storage area in a location corresponding to the location of the associative element associated thereto.

42 Claims, 10 Drawing Sheets

OTHER PUBLICATIONS

MOSAID Technologies Incorporated. "The Next Generation of Content Addressable Memories". Sep. 2000.

P. Grupta et al. "Packet Classification on Multiple Fields". SIGCOMM, pp. 147–160 (1999).

F. Shafai et al. Fully Parallel 30 MHz 2.5 Mb 5b CAM. IEEE Journal of Sold–State Circuits, vol. 33, No. 11, Nov. 1998.

D. Shah et al. "Fast Incremental Updates on Ternary–CAMs for Routing Lookups and Packet Classification". Proc. Hot Interconnects VIII, Aug. 2000.

"Fast updating Algorithms for TCAMs" Shah et al, IEEE 2001 Jan.–Feb. 2001 pp. 36–47.

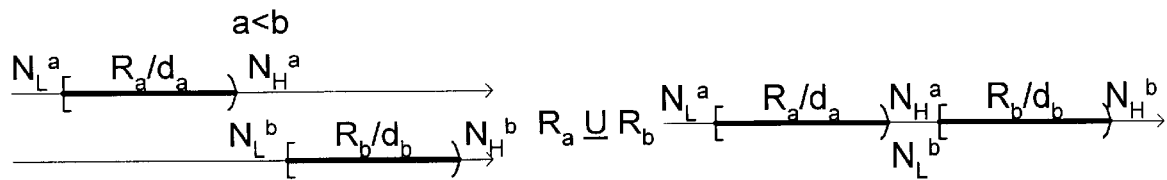
(a)
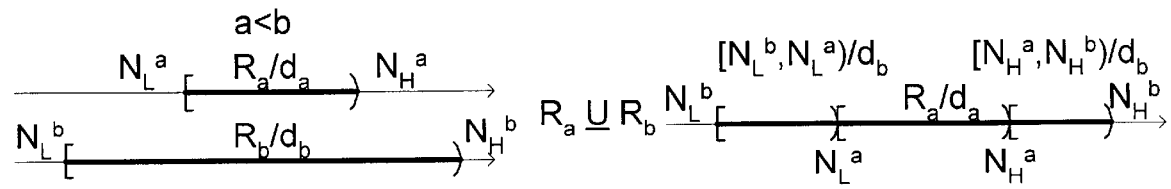
(b)
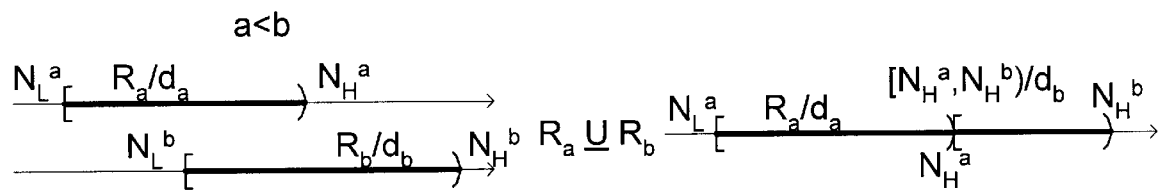
(c)
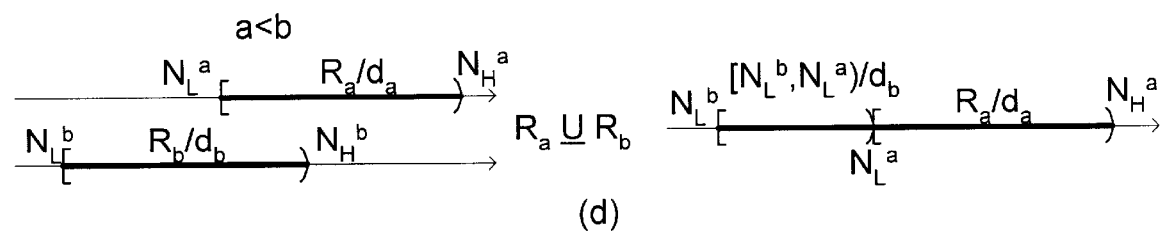
(d)
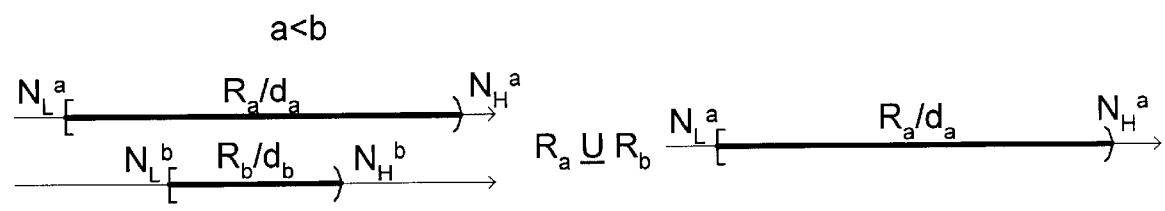
(e)
"a<b" means that a is higher in priority than b
Fig. 3

RANGE CONTENT-ADDRESSABLE MEMORY

This application claim the benefit of a Provisional Application No. 60/181,110 filed Feb. 8, 2000.

FIELD OF THE INVENTION

The present invention relates to the field of Content Addressable Memory (CAM). More particularly, the invention relates to a method and apparatus for storing associative ranges containing keys and data associated with said ranges, in form of a lookup table, in which a searched associative key found within a range is used to extract the associated data.

BACKGROUND OF THE INVENTION

Content Addressable Memory (CAM) devices are specially designed for storing information in the form of a lookup table. CAM structures allow a direct and fast search of data items, a search which is based on an associative key. Software implementations of such data structures are usually slow for real time applications, especially in view of the great advances of the recent years, in data transmission rates.

In general, CAM comprises storage of key words, and a separate storage for associated data items. For each of the stored key words, there is a corresponding associated data item. Therefore, the structure and operation of CAMs differs from those of conventional memory devices, such as RAM, wherein each data item is addressed by utilizing a unique address. In CAMs, data items are fetched from the CAM device by submitting a key value. The key words storage is then searched to determine if a matching key word is stored inside the CAM. If there is a key-matching entry found in the CAM, a 'match' indication is issued, and the corresponding associated data (i.e., the data item associated with the key) is output from the CAM. If there is no matching key, a 'mismatch' indication is issued.

The efficiency and high speed, inherent to the CAM implementations, makes them very attractive for address filtering and routing in networking applications. The Internet routers, for instance, maintain a list of Internet Protocol (IP) Destination Addresses (IPDAs), and their associated interfaces (e.g., port numbers) through which the router should forward the received packet. This list is utilized to determine the best route for a packet of information received by the router to reach its destination. More particularly, said list of IPDAs and the interfaces is organized in the form of a lookup table. The key word associated with each IPDA, is the router interface of the destined network node (i.e., the next routing point, to which the received packet is destined).

Each IPDA is a unique 32-bit entity, usually represented in the form of four octets (sequences of eight bits, e.g., 192.30.50.0), comprising address information of the destined node within that network.

The original IP network classification method, utilizing five basic Classes for any network on the Internet, turned out to be very expansive in terms of IPDA address space consumption, and in terms of the routing table size, required for forwarding lookups. As a consequence, the Internet ran out of address space very quickly. This has also led to an outstanding growth in the size of the routers' lookup tables.

I order to overcome the problems described herein above, the Internet Engineering Task Force (IETF) devised a more flexible method (as described in RFC1519), known as the Classless Inter-Domain Routing (CIDR). The CIDR resolves the difficulties stemming from the original network Address-Class hierarchy by aggregating multiple routes into a single representation. Address aggregation is achieved by masking a contiguous number of address 32-p least significant bits, which leads to a representation of a range of addresses by a single address and its mask. This leaves p bits also defined as the address prefix, which should be compared. p can be any integer value from 0 to 32. The convention used to describe a CIDR address entry is A/p, where A is the address and p is the prefix. For example, the CIDR address entry 192.30.50.0/24 matches any IPDA address in the range 192.30.50.0←→192.30.50.255.

Generally a CIDR address may match with multiple number of entries in the router's key list, this due to the presence of overlapping address ranges. Selection of one out of multiple matches is based upon the most specific match, which is the one with the longest prefix.

The CIDR addressing scheme allows a more efficient allocation of IP addresses, which results in significant reduction in the size of the routing table, yet the growth of the Internet is seems to be increasing with time, and the difficulties stemming from this growth in routing table size still remain.

The modern routers are now designed for CIDR compliance. Ternary CAM technology is widely adopted in routers implementation, but the substantial growth in the size of routing tables, and the many comparison operations required to determining a key match, influence performance and power consumption. Other complications in Ternary CAM (TCAM) implementations are due to the complexity involved in determining the key match to a range of possible values, and especially utilizing CIDR's longest-prefix-match policy. The conventional CAM implementations are efficiently designed for lookup tables when an exact match of key values is required, but the situation is more complex when a range of values need to be matched. Moreover, the aggregation efficiency is greatly influenced by the allocated address space, which in many cases is not covered by a single mask prefix, resulting in a substantial increase of routing table's sizes.

In addition, Ternary CAMs are limited with respect to the ranges boundaries, which are limited only to integer values being $\alpha \cdot 2^{32-p}$, where a is an integer, and p is the prefix length. Therefore, the boundary values do not represent the whole range of non-negative integer values. This eliminates the capability of further aggregation over and beyond the one offered by the CIDR method.

Since, multiple matches are feasible all the entries must be simultaneously compared to a key, which stems in a high power consumption, that grows proportionally to the number of entries and with the lookup rate. For instance a typical 64 K Ternary CAM consumes about 10 Watts at a rate of 66 million lookups per second.

Due to the requirement to arrange Ternary CAM entries in prefix-length order, the database update may become cumbersome and lengthy in time.

Ternary CAM's basic cell is complex, since it incorporates the address, the mask and the comparator. The resulting cell size, substantially limits the amount of entries per TCAM device in comparison with an SRAM. The biggest TCAM (for instance SiberCore's SiberCAM Ultra-2M) implemented today, incorporates 64 K IPv4 CIDR address entries without the associated data.

"IP Lookups using Multiway and Multicolumn Search", B. Lampson et al, Proceedings of IEEE Infocom, Volume 3, April 1998, pages 1248–1256 discloses a search method based on an interaction between a processing device and a memory, using binary search based algorithm for CIDR address searches. This method results in having a unique memory entry in which the result may reside. However, it offers a search performance, which varies as $\log_2 n$, where n represents the number of entries. This is worse in performance than a Ternary CAM, which is insensitive to the lookup table size. Furthermore, this implementation is unsuitable for high-performance routing, due to it lookup rate limitation.

All the methods described above have not yet provided satisfactory solutions to the problem of efficient storage of associative data in lookup tables, and which might result in low power consumption and in high search performance.

It is an object of the present invention to provide a Range Content Addressable Memory (RCAM) being capable of Searching a whether a submitted key belongs to a range bounded by two non-negative integers, that has a common associated data.

It is another object of the present invention to provide an RCAM for storing and searching associative data items related to, disjoined and/or overlapping ranges.

It is another object of the present invention to provide an RCAM, which allows efficient associative data aggregation, using less storage space.

It is a further object of the present invention to provide an RCAM, in which the power consumption does not grow in proportion with the amount of data entries stored and searched.

It is a still another object of the present invention to provide an RCAM, in which the associating keys are represented in an efficient form.

Other objects and advantages of the invention will become apparent as the description proceeds.

SUMMARY OF THE INVENTION

The present invention is directed to a method for arranging and storing, in a memory, associative key data set of associative elements and a corresponding associated data set of associated elements, where each associative element corresponds to a range of consecutive values, such that an associated element may be extracted from the memory as valid data if an associative key belongs to its associative element, the range may be represented by its lower and upper extreme values. A memory device(s) is provided for storing the associative key data set and the associated data set, that comprises a first and a second storage areas, so that to each storage location in the first storage area there is a corresponding storage location in the second storage area. The associative elements of the key association data set and their corresponding associated data set are arranged in an order determined by priority precedence, such that associative elements having higher priority are placed before associative elements having lower priority A unique index is assigned for each associative element for representing its ordered location. At least one of the extreme values of each associative element is stored in the first storage area in a location that corresponds to the priority of the associative element. Each value of the associated data set is stored in a location in the second storage area, that corresponds to the location of the associative element to which it is associated.

Preferably, associated data values are extracted from the memory upon conducting a key search on the associative key data. Upon receiving an input key, one or more associative elements that may contain the input key are sought, and if no such associative element(s) is found, a mismatch signal is output, for indicating that the associated data that is output is invalid. If the input key is contained in one or more associative element(s), the associated data that corresponds to the associative element having the highest priority that contains the input key, and a match signal indicating that the associated data that is being output is valid, are output.

3. The lower and/or the upper extreme value of one or more ranges may be a non-negative value. The associative elements of the key association data set may be ranges of consecutive values having semi-open/semi-closed boundaries. Each range may have a closed boundary as its lower boundary, and an opened boundary as its upper boundary, thereby defining a range of associative elements, each of which contains the value of its corresponding lower boundary and all its consecutive values, except for the value of its upper boundary. Alternatively, each range may have a closed boundary as its upper boundary, and an opened boundary as its lower boundary, thereby defining a range of associative elements, each of which contains the value of its corresponding upper boundary and all its consecutive values, except for the value of its lower boundary. The ranges that correspond to different associative elements may be non-overlapping ranges.

Preferably, whenever the ranges that corresponds to different associative elements are overlapping ranges, the overlapping ranges are converted into one or more equivalent non-overlapping ranges. Overlapping ranges are combined by truncating overlapping portions from ranges having lower priority, while maintaining with no change, for each set of overlapping portions, a single portion having the highest priority within the set, thereby obtaining an equivalent set of non-overlapping ranges. The non-overlapping ranges of the equivalent set are arranging in a descending/ascending order, according to the boundary values of each of the ranges.

Preferably, whenever a first range contains both, the upper and the lower, boundaries of a second range with lower priority, the second range is represented by the first range. The second range element is removed from the associated key data set, and its associated data element is removed from the associated data set. Whenever a first range contains only the upper boundary of a second range with lower priority, the second range is truncated to include the interval of values between its lower boundary and the lower boundary of the second range, thereby obtaining adjacent ranges having the same data association that corresponds to the first and the second ranges. Whenever a first range contains only the lower boundary of a second range with lower priority the second range is truncated to include the interval of values between its upper boundary and the upper boundary of the first range, thereby obtaining adjacent ranges having the same data association that corresponds to the first and the second ranges. Whenever both, the upper and the lower, boundaries of a first range are contained in a second range with lower priority the second range is truncated into two smaller ranges, a first smaller range that includes the interval between the lower boundary of the second range and the lower boundary of the first range, and a second smaller range that includes the interval between the upper boundary of the first range and the upper boundary of the second range, thereby obtaining three adjacent ranges where the two smaller ranges have data association which is the same as the data association of the second range, while the first range and its data association remain unchanged. This process is repeated for pairs of overlapping ranges as long as there is an overlap between more than two ranges, each time for the resulting ranges, until the last resulting ranges do not overlap.

Preferably, associated data values are extracted from the memory upon conducting a key search on the associative key data. Upon receiving an input key, one or more associative equivalent non-overlapping ranges that may contain the input key are sought, and if no such associative equivalent non-overlapping range(s) is found, a mismatch signal is output for indicating that the associated data that is being output is invalid. If the input key is contained in an associative equivalent non-overlapping range, the associated data that corresponds to that associative equivalent non-overlapping range is output, and a match signal indicating that the associated data that is being output is valid.

Preferably, match between an input key and an associative element is detected using a single comparison between the input key and the boundaries of equivalent non-overlapping ranges. The key association data set is converted into an equivalent non-overlapping data set. The boundary values of the equivalent non-overlapping data set are stored in an ascending order in the first storage area. Boundary type information is stored in a third storage area. The boundary type information indicates if a boundary is opened or closed, thereby having for each location in the first storage area a corresponding location in the third storage area. The associated data set is stored in the second storage area in locations that correspond to the locations of closed boundaries of the equivalent non-overlapping data set stored in the first storage area. A key match is detected by concurrently performing a single comparison operation between each boundary value stored in the first storage area and the input key, to determine whether the input key is larger than the boundary value. A TRUE value is issued whenever a comparison result with the input key indicates that the input key is larger than the boundary value, otherwise, a FALSE value is issued. A match is detected whenever a transition of the comparison results, from a TRUE value to a FALSE value is obtained. The index of the match being the index of the last boundary value for which a TRUE value has been obtained, is issued. The boundary type information is retrieved from the third storage area that corresponds to the index, so that a match is obtained whenever the retrieved boundary type information indicates that the value with which the comparison operation was performed is a closed boundary value. The index is used to fetch the associated data from the second storage area.

Whenever each associative element comprises two values, a first value which is the lower boundary of a range, and a second value which is an upper boundary of the range, a key match is detected by concurrently performing two comparison operations for every range in the key association data set, a first comparison to determine whether the input key is larger than, or equals to, the range's lower boundary, and a second comparison to determine whether the input key is smaller than the range's upper boundary. A TRUE value is issued whenever the input key is larger than, or equals to, the range's lower boundary, and smaller than the range's upper boundary. A match is indicated to each range, which yields a TRUE value, and the match with the highest priority is selected. The index of the match having the highest priority is issued and the associated data is retrieved by utilizing this index. A validation signal, which is utilized to validate a match indication may be added to ignore search results in a desired location(s).

Whenever a value that belongs to a space that consists of one or more ranges, may be represented by k bits that represent the opened boundary of the space by k+1 bits, such that a "0" logic value is assigned to k consecutive bits and a "1" logic value is assigned to the remaining bit. Each value that does not belong to a range and is beyond the opened boundary of the range may be represented by k+1 bits, such that a "0" logic value is assigned to k consecutive bits and a "1" logic value is assigned to the remaining bit. The range may represent Classless Inter Domain Routing (CIDR) addresses.

Preferably, an input key search may be performed simultaneously in one or more associative elements, or in one or more equivalent non-overlapping ranges, that may contain the input key.

Whenever the ranges that corresponds to different associative elements are overlapping ranges, a match between an input key and a range is sought by arranging the ranges in their priority precedence order, comparing the input key with the values within each range, and obtaining one or more match indications whenever the input key belongs to one or more a ranges. The match indication corresponding to the range having the highest priority is selected.

The present invention is also directed to an apparatus for arranging and storing, in a memory, associative key data set of associative elements and a corresponding associated data set of associated elements, where each associative element corresponds to a range of consecutive values, such that an associated element may be extracted from the memory as valid data if an associative key belongs to its associative element, the range may be represented by its lower and upper extreme values. The apparatus comprises a memory device(s), for storing the associative key data set and the associated data set, that comprises a first and a second storage areas, so that to each storage location in the first storage area there is a corresponding storage location in the second storage area, in which the associative elements of the key association data set and their corresponding associated data set are arranged in an order determined by priority precedence, such that associative elements having higher priority are placed before associative elements having lower priority; a unique index is assigned for each associative element, representing its ordered location; at least one of the extreme values of each associative element is stored in the first storage area in a location that corresponds to the priority of the associative element; and each value of the associated data set is stored in a location in the second storage area, that corresponds to the location of the associative element to which it is associated.

The apparatus may further comprise circuitry for extracting associated data values from the memory upon conducting a key search on the associative key data, including:

a) circuitry for seeking one or more associative elements that may contain a searched input key, upon receiving the input key;

b) circuitry for outputting the associated data that corresponds to the associative element having the highest priority that contains the input key; and c) circuitry for outputting a mismatch signal, indicating that the associated data that is being output is invalid, if no such associative element(s) is found and a match signal indicating that the associated data that is being output is valid, if the input key is contained in one or more associative element(s).

10. The lower and/or the upper extreme value of one or more ranges that are stored in the apparatus may be a non-negative value. The associative elements of the key association data set may be ranges of consecutive values having semi-open/semi-closed boundaries. Each range that is stored in the apparatus may have a closed boundary as its lower boundary, and an opened boundary as its upper boundary, or alternatively, a closed boundary as its upper boundary, and an opened boundary as its lower boundary. The ranges that correspond to different associative elements and stored in the apparatus may be non-overlapping ranges.

Overlapping ranges that are stored in the apparatus may be converted into one or more equivalent non-overlapping ranges, by combining overlapping ranges by truncating overlapping portions from ranges having lower priority, while maintaining with no change, for each set of overlapping portions, a single portion having the highest priority within the set and by arranging the non-overlapping ranges of the equivalent set in a descending/ascending order, according to the boundary values of each of the ranges.

The present invention is also directed to an apparatus in which associated data values may be extracted from the memory of the apparatus upon conducting a key search on the associative key data. This apparatus may comprise:

a) circuitry for seeking one or more associative equivalent non-overlapping ranges that may contain a searched input key, upon receiving the input key;

b) circuitry for outputting the associated data that corresponds to the associative equivalent non-overlapping range that contains the input key; and c) circuitry for outputting a mismatch signal, indicating that the associated data that is being output is invalid, if no associative equivalent non-overlapping range is found and a match signal indicating that the associated data that is being output is valid, if the input key is contained in the associative equivalent non-overlapping range.

The present invention is also directed to an apparatus, in which a match between an input key and an associative element is detected using a single comparison between the input key and the boundaries of equivalent non-overlapping ranges. This apparatus may comprise:

a) a first storage area for storing the boundary values of the equivalent non-overlapping data set in an ascending order;

b) a second storage area for storing the associated data set in the in locations that correspond to the locations of closed boundaries of the equivalent non-overlapping data set;

c) a set of comparators for concurrently performing comparisons between each boundary value stored in the first storage area and the input key, to determine whether the input key is larger than the boundary value;

d) circuitry for issuing a TRUE value whenever a comparison result with the input key indicates that the input key is larger than the boundary value, and for issuing a FALSE value if the input key is equal to, or smaller than the boundary value;

e) an encoder for detecting a match whenever there is a transition of the comparison results, from a TRUE value to a FALSE value, and for issuing the index of the last boundary value, for which the comparison result is a TRUE value;

f) a third storage area for storing boundary type information, represented by a bit that indicates whether the boundary value is a closed or opened boundary, the bit is retrieved form the location in the third storage area defined by the index; and g) circuitry for outputting the associated data that corresponds to the index from the second storage area.

The present invention is also directed to an apparatus, in which each associative element comprises two values, a first value which is the lower boundary of a range, and a second value which is an upper boundary of the range. This apparatus may comprise:

h) an ordered set of storage and detection units for storing the upper and lower boundaries and for detecting a key match represented by issuing a TRUE value, by concurrently performing two comparison operations for the boundaries, a first comparison to determine whether the input key is larger than, or equals to, the range's lower boundary, and a second comparison to determine whether the input key is smaller than the range's upper boundary;

i) circuitry for selecting the match with the highest priority, and for issuing the index of the match having the highest priority; and j) circuitry for outputting the associated data that corresponds to the index.

Each storage and detection unit may generate a validation flag, for enabling/disabling a match detection.

Each value that belongs to a range may be represented in the apparatus by k bits, representing the opened boundary of the range by k+1 bits, such that a "0" logic value is assigned to k consecutive bits and a "1" logic value is assigned to the remaining bit. Each value that does not belong to a range and is beyond the opened boundary of the range may be represented in the apparatus by k+1 bits, such that a "0" logic value is assigned to k consecutive bits and a "1" logic value is assigned to the remaining bit. The range may represent Classless Inter Domain Routing (CIDR) addresses.

An input key search may be performed in the apparatus simultaneously in one or more associative elements that may contain the input key, or one or more equivalent non-overlapping ranges that may contain the input key.

The present invention is also directed to an apparatus for storing and outputting associative ranges and their associated data, and for seeking for matching ranges that may contain a searched input key, that comprises:

a) an Entry list storage consisting of an ordered set of Range Words (RW) devices each of which comprises:
  a.1) a first memory cell for storing the lower boundary of an associative range;
  a.2) a second memory cell for storing the upper boundary of the associative range;
  a.3) an input for inputting the searched input key;
  a.4) a validation flag input for indicating that the the lower and upper boundaries are valid;
  a.5) an output for indicating a match whenever, the validation flag input provides a valid indication, and the comprises the searched input key;

the RW devices are indexed according to their location, and the ranges that are stored in the RW devices are organized in a priority precedence order.

b) a priority encoder for detecting the match indication from an RW device with the highest priority, the priority encoder comprises:
  b.1) inputs for receiving the outputs of the Range Word devices;
  b.2) a first output for indicating a match;
  b.3) a second output for issuing the index of the matching RW device having the highest priority;

a) a memory for storing the associated data from which the data associated with the highest priority range having a match, is output, the memory comprises:
  a.1) a set of memory cells for storing the associated data, each data item of the associated data is stored in a location corresponding to the RW device which stores the range values that the data item is associated with;

a.2) an input of the second output of the priority encoder carrying the index of the match having the highest priority; and a.3) an output for outputting the data associated with the range having the highest priority match, by utilizing the input as a pointer to the location in which the associated data is stored.

The range value stored in the first memory cell in the apparatus may a closed lower boundary, and the value stored in the second memory cell is an opened upper boundary.

Preferably, the Range Word device comprises:

a) a first comparator having a first input connected to the input of the searched input key, and a second input connected to the first memory cell, and an output for issuing a TRUE indication whenever the value on the first input is smaller than the value on the second input;

b) a second comparator having a first input connected to the input of the searched input key, and a second input connected to the second memory cell, and an output for issuing a TRUE indication whenever the value on the first input is smaller than the value on the second input;

c) an inverter having an input connected to the output of the first comparator, and an output for outputting the inverted comparison result from the first comparator;

d) a first AND gate having an input connected to the output of the inverter, and another input connected to the output of the second comparator, the first AND gate outputs a TRUE indication whenever the searched key is, smaller than the value stored in the second memory cell, and greater than, or equals to, the value stored in the first memory cell; and e) a second AND gate having an input connected to the output of the first AND gate, and another input connected to the validation flag input, the second AND gate outputs a TRUE indication whenever, a valid indication is obtained from the validation flag input, and a TRUE indication is input into the input from the output of the first AND gate.

The present invention is also directed to an apparatus in which overlapping ranges are converted into one or more equivalent non-overlapping ranges, by combining overlapping ranges by truncating overlapping portions from ranges having lower priority, while maintaining with no change, for each set of overlapping portions, a single portion having the highest priority within the set and by arranging the equivalent non-overlapping ranges of the equivalent set in a descending/ascending order, according to the boundary values of each of the ranges, and each equivalent non-overlapping range has a closed boundary as its lower boundary and an opened boundary as its upper boundary. This apparatus may comprise:

a) an Entry List storage device consisting of an ordered set of memory cells for storing entries, each of which being a value that represents at least one boundary value of a equivalent non-overlapping range and is indexed according to its relative location, the entry comprises a k-bit value, the Entry List storage device comprises:

a.1) an ordered set of boundary entries stored in the order of the equivalent non-overlapping ranges, where an index 1 is assigned to the first boundary value of the first equivalent non-overlapping range that is stored in the first memory cell, and the last boundary value, with index i, is stored in the i'th memory cell;

a.2) zero values stored in all of the remaining memory cells that do not contain boundary values;

b) circuitry for detecting a match between a searched input key and an equivalent non-overlapping range, and for issuing the index of the matching equivalent non-overlapping range, comprising:

b.1) a k-bit key input for inputting the searched input key;

b.2) an input for inputting an Empty flag indication representing a state where the Entry List storage device is empty;

b.3) an ordered set of k-bit inputs, each of which is connected to the output of a corresponding memory cell from the Entry List storage device;

b.4) a set of ordered comparators each of which, except for the first comprator, comprises:

b.4.1) a first input connected to a corresponding k-bit input;

b.4.2) a second input connected to the k-bit key input;

b.4.3) an output for outputting a TRUE indication whenever the value of the first input is smaller than the value of the second input, and a FALSE indication whenever the value of the first input is greater than the value of the second input;

b.4.4) circuitry for producing a logic "1" whenever a zero value is obtained on the first input, such that zero values obtained on the first input, are expanded in the comparators into a k+1 bit value having "1" at their most significant location, and zeros in all of the remaining locations;

b.5) a first comparator that comprises:

b.5.1) a first input connected to the first k-bit input;

b.5.2) a second input connected to the k-bit key input;

b.5.3) an output for outputting a TRUE indication whenever the value of the first input is smaller than the value of the second input, and a FALSE indication whenever the value of the first input is greater than the value of the second input;

b.6) a Range Encoder for producing the index of a matching range whenever the Entry List storage device is not empty, by detecting the transition point of the outputs of the set of ordered comparators from a series of consecutive TRUE indications to a FALSE indication, and for producing an indication whenever the searched input key is larger than any entry in the Entry List storage device;

c) a Boundary Type storage device for storing and outputting a match or mismatch indication whenever the index of a matching range value that is received, corresponds to a closed boundary value, the Boundary Type storage device comprises:

c.1) an ordered set of storage device containing boundary type bits each of which corresponds to a memory cell in the Entry List storage device, and is utilized for storing "1" whenever a closed boundary is stored in the corresponding memory cell, and for storing "0" whenever an opened boundary is stored in the memory cell;

c.2) an input for inputting the index;

c.3) an output for outputting the boundary type bits, that is utilized for indicating a match or a mismatch;

c.4) circuitry for outputting the boundary type bits on the output, utilizing the index value received on the input to select the boundary type bit from the ordered set of storage device;

d) associated data storage device for storing and outputting the data associated with each range of the equivalent non-overlapping set of ranges, the associated data storage device comprises:

d.1) an ordered set of memory cells for storing associated data in locations that correspond to the locations of the closed boundary values having association with the associated data;

d.2) an input for inputting the index;

d.3) an output for outputting associated data stored in the ordered set of memory cells;

d.4) circuitry for outputting the associated data on the output, utilizing the index value received on the input to retrieve the associated data from the ordered set of memory cells; and e) circuitry for disabling/enabling the output from the Boundary Type storage device by utilizing the indication of a searched input key that is larger than any entry in the Entry List storage device, to disable/enable the output from the Boundary Type storage device.

The Range Encoder may comprise:

a) a set of ordered inputs for receiving the outputs of the set of ordered comparators;

b) an input for receiving an Entry List Empty indication, whenever the Entry List storage device does not comprise associative data;

c) a first output for outputting the index of the matching range value;

d) a second output for outputting an indication whenever the searched input key is larger than any range value stored in the Entry List storage device; and e) an encoder for outputting the index of the matching range.

BRIEF DESCRIPTION OF THE DRAWINGS

In the drawings:

FIG. 3 graphically demonstrates the results of combining two ranges into an equivalent set of non-overlapping ranges;

DETAILED DESCRIPTION OF PREFERRED EMBODIMENTS

The present invention introduces a novel type of associative CAM device—a Range Content Addressable Memory. The Range Content Addressable Memory (RCAM) combines the memory function with associative processing capabilities, and it is specifically designed to match a key with a range of possible associative keys (integer values). More precisely, the RCAM yields a match indication if it determines that the key presented to it belongs to one of a predetermined set of value ranges. Therefore, it stores intervals of integer values, and unique data items (also an integer value) associated with each interval.

If it is determined that the submitted key (the key presented to the RCAM) falls in one of the intervals defined in the RCAM, the data associated with the interval is retrieved, and a match signal m is issued. The present invention teaches a method for implementing an RCAM device and demonstrates the usefulness of the range search approach. Before proceeding any further in the description of the present invention, some definitions and terms, as they appear in here, are be explained hereinbelow.

2.

Ranges

The range R, denoted by; $R \equiv [N^L, N_H)$, wherein $N_H$ and $N_L$ are integers such that $N_H > N_L \geq 0$, is a consecutive range of the integer numbers starting from $N_L$ and ending at $N_H$. The notation utilized for the lower bound of the range R, "[", square angled brackets, denotes a closed boundary, meaning that the range includes its lower bound, $N_L$. On the other hand, the upper bound is an open boundary, and is denoted by a rounded brackets ")", meaning that the upper bound is excluded, i.e., does not belong to the range R.

With this definition for a range, given an integer K, the term "match" is utilized to designate that K belongs to the rage R, $K \in R$, if the following holds $N_L \leq K < N_H$. As follows, from the range definition given herein above, if K matches the range R, then it may be equal to, or bigger than $N_L$ (the closed boundary), and as this definition also states, it is essentially smaller than $N_H$. It therefore clear, from this range definition, that zero may appear only as the lower boundary, $N_L$, of a range.

Figure 1:
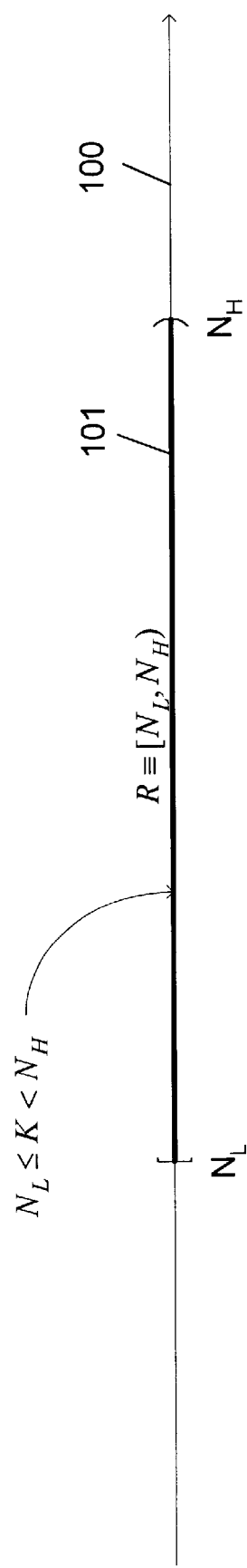
FIG. 1 graphically demonstrates the meaning of a range, according to the method of the invention.

FIG. 1 graphically illustrates the meaning of a range, in accordance with the range definition given herein above. The range $R \equiv [N_L, N_H)$, 101, is depicted as a semi-closed interval on the integer number axis 100 (positive and negative numbers comply with the range definition). The range's lower boundary is $N_L$, and the range's higher boundary is $N_H$. As explained before, $N_L \in R$, namely, the range's lower boundary, belongs to the range (i.e., it is a part of the range). On the other hand, $N_H \notin R$, that is, the range's high boundary, does not belong to the range. Thus, the range as defined herein, is a Semi-closed/Semi-opened interval of integers.

The range definition hereinabove has been selected, since it implies significant savings in the RCAM implementation, and eliminates multiple matches on Search operation, as will be demonstrated herein. Alternatively, one may adopt a range definition, which is also Semi-opened/Semi-Closed interval, but in which the opened boundary is on the left-hand side, and the closed boundary is on the right-hand side.

Spaces

The space $\Omega$ designates the space of all possible k-bit integer values (the integer values $0 \leftarrow \rightarrow 2^k-1$). Thus, any integer value $K \in \Omega$, has a binary representation consisting of a finite and constant number of bits k, $K \equiv (a_{k-1}, a_{k-2}, \ldots a_i, \ldots a_1, a_0)_2$, such that $a_i \in \{0,1\}_{(0 \leq i < k)}$. Hence, the entire space comprises all integer values K such that $$(0, 0, \ldots, 0)_2 \leq K \leq (1, 1, \ldots, 1)_2$$
$$|\leftarrow k\ bits \rightarrow| \qquad\qquad |\leftarrow k\ bits \rightarrow|$$

Consequently, the entire space $\Omega$ is also a range, incorporating all the possible values in the range, wherein $$N_L = (0, 0, \ldots, 0)_2,$$
$$|\leftarrow k\ bits \rightarrow|$$

is a k-bit binary number, while $$N_H = (1, 0, 0, \ldots, 0)_2,$$
$$|\leftarrow k+1\ bits \rightarrow|$$

is a k+1 bits binary number.

Thus, the entire range is actually $$\Omega \equiv \left[ (0, 0, \ldots, 0)_2, (1, 0, 0, \ldots, 0)_2 \right]$$
$$\quad\ |\leftarrow k\ bits \rightarrow| \quad |\leftarrow k+1\ bits \rightarrow|$$

Since we are dealing with k-bits digital systems, the representation of k+1 bits is not practical. But as was stated hereinbefore, the zero element of the space $\Omega$, essentially, may only appear as the closed lower boundary of a range. This observation will be utilized later to simplify the representation of the upper boundary of the space $\Omega$. From now on, the combination $$(0, 0, \ldots, 0)_2$$
$$|\leftarrow k\ bits \rightarrow|$$

is reserved (i.e., the zero element of the space), and is utilized for designating the space's upper boundary (the right-most integer value $N_H>0$, $N_H \notin \Omega$). This representation may be interpreted as having an implied k+1 leftmost bit, which is "1". This bit, which is not shown, will be defined hereinafter, as a Silent "1" Bit.

In accordance with the above, the range $\Omega$ may be represented in the following way:

$$\Omega \equiv \left[ (0, 0, \ldots, 0)_2, (1, 0, 0, \ldots, 0)_2 \right]$$
$$\quad\ |\leftarrow k\ bits \rightarrow| \quad |\leftarrow k\ bits \rightarrow|$$

and in a decimal notation, the range $\Omega$ is thus represented this way, $\Omega \equiv [0,0)$. In this representation (decimal), the Silent "1" Bit convention is utilized for designating the $\Omega$ Range Opened Bound ($N_H = 2^k \notin \Omega$), and it appears in the form of "0".

Utilizing this convention, the match of an integer value K to the range $A \leq K < N_H = 2^k$, may be equivalently designated as follows, $K \in [A,0) \rightarrow K \geq A$, wherein K and A are integer values. Thus, $R = [A,0)$ represents all the integers greater than or equal to an integer A in a given space $\Omega$. As will be demonstrated later, this type of an inequality expression is very efficient and useful for packet classification.

In a similar fashion, if there is a match of a given integer value K to the range, $0 \leq K < A$, this may be equivalently designated by $K \in [0,A) \rightarrow K < A$. The range $R = [0,A)$ is actually the range of all integers smaller than an integer A, in a given space $\Omega$. A single integer is also a range in the $\Omega$ space, and may be represented as $K = [A, A+1) \rightarrow K = A$.

The most common operation to be performed over ranges is to perform a search and to figure out to which range a Key K (an integer value) belongs, and to get as a result data, also called an Associated Data. Associated Data is a unique integer value, associated with the found Range.

Overlapping Ranges

Two Ranges $R_a$ and $R_b$ are called Overlapping Ranges if there is an integer K such that $K \in R_a$ and $K \in R_b$.

In general, a Key search over a set of ranges might yield inconsistent results, since the Key might be found in several Overlapping Ranges, each one having its own unique Associated Data.

To facilitate Range-Overlapping we must introduce the notion of Priority. Thus, if the Key-search results in several matches, the Associated Data of the highest priority matching Range is selected.

Priority

Given a set of n Overlapping Ranges $\Re \equiv \{R_1, R_2, \ldots, R_i, \ldots, R_n\}$, and a corresponding set of values, the set of Associated Data $D \equiv \{d_1, d_2, \ldots, d_i, \ldots, d_n\}$ (a set of n integer values), where both of the sets are arranged in their priority order, that is $R_i$ is higher in priority than $R_j$ if i<j, and given an integer value K, such that, $$K \in R_{i1}, K \in R_{i2}, K \in R_{i3}, \ldots, \text{and } K \in R_{ip}\ (i1 < i2 < i3 < \ldots < ip)$$

wherein i1,i2,i3, . . . ,ip are the indexes of all the Ranges to which K belongs, then $R_{i1}, R_{i2}, R_{i3}, \ldots, R_{ip}$ are defined as the K—Matching Ranges.

The set of ranges $\Re \equiv \{R_1, R_2, \ldots, R_i, \ldots, R_n\}$ will be referred to hereinafter as the Associative Range Set, and the set of $D \equiv \{d_1, d_2, \ldots, d_{di}, \ldots, d_n\}$ as the Associated Data Set. The integer K, will be referred to hereinafter as the Key, used to search and select a single element from the Associated Data Set D.

The function $\aleph$ is defined as an Associative Function, which maps of $\Re$, D, and K into a (d,m) pair in the following way, $$m = \begin{cases} 0 & \text{if } K \notin R_i \\ 1 & \text{if } K \in R_i \end{cases}; (1 \leq i \leq n); d = \begin{cases} x & \text{if } m = 0 \\ d_i & \text{if } m = 1 \end{cases}$$

where i is the highest priority index (or the lowest index value) of all the matching Ranges, as defined hereinabove, and d is an integer value, $d \geq 0$, which will be also referred to hereinafter as the Key Associated Data. The variable m is a Boolean variable (may equal either a "1" or "0" values), and which will be referred to hereinafter as the Key Match value.

It should be clear that if m="0" there is no meaning to the value of d, whatever it may be. This is represented as d=x, wherein x stands for "Don't Care". Additionally, the highest priority Matching Range $R_i$ and its Key Associated Data $d_i$, are of the same index i.

The Associative Function, Associative Range Set, Associated Data Set, and their priority-based ordering, which are defined hereinabove, facilitates the acquisition of a consistent result, for each Key search. The searching for the Associated Data of a certain integer K (the Key) is comprised of the following steps Step 1: Find the index i of the highest priority K—Matching Range.

Step 2: Use this index to access the Associated Data (The Associated Data is the i'th element in the Associated Data Set).

More particularly, the method for searching for a Key Associated Data comprises the steps:

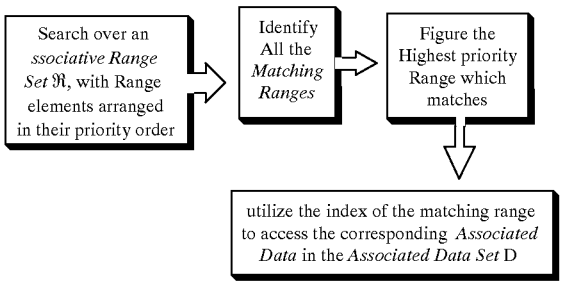

Figure 2:
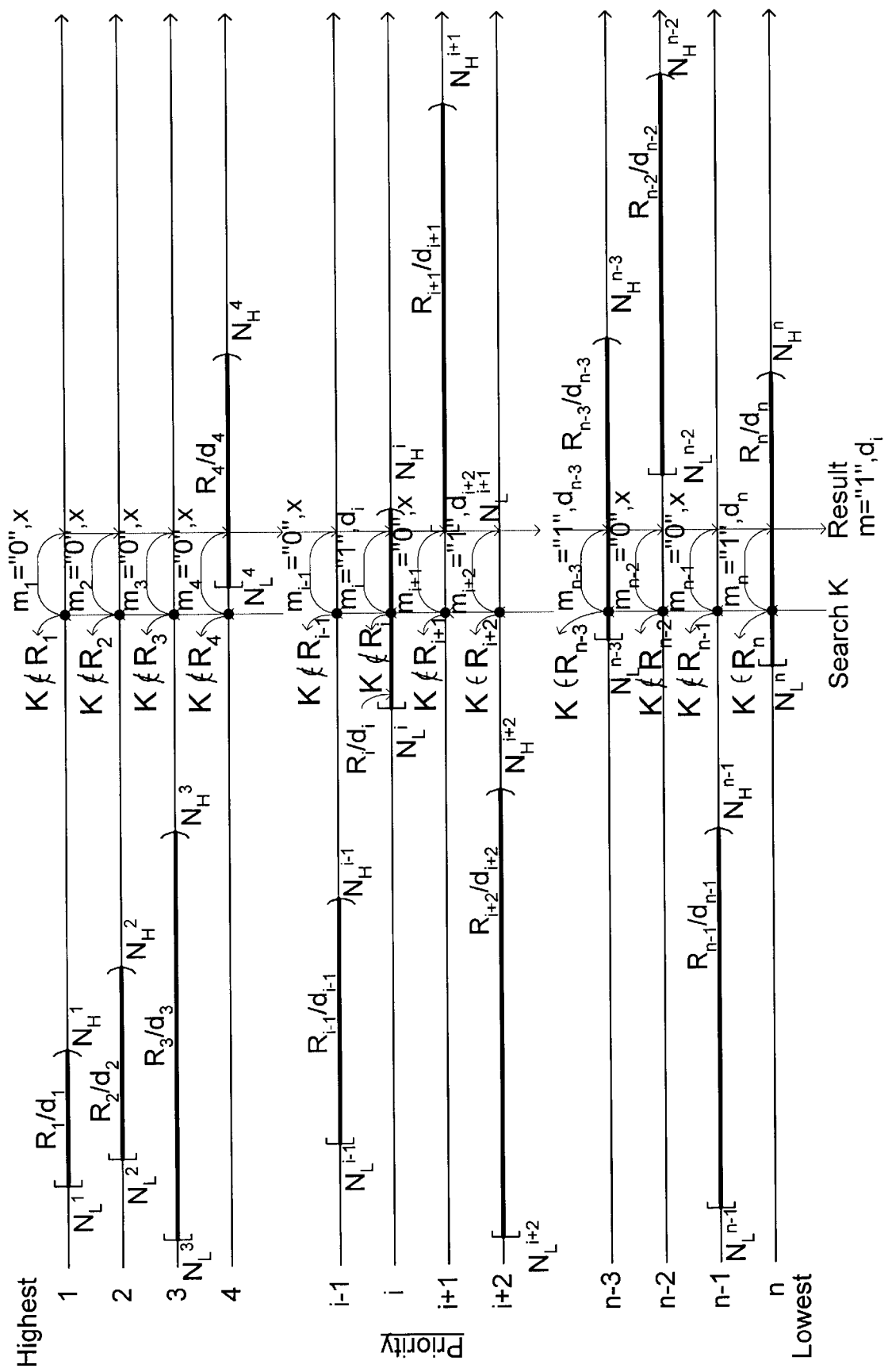
FIG. 2 graphically illustrates the process of searching for key match, and for a Key Associated Data.

This process is demonstrated in FIG. 2, wherein each range $R_q$, and its corresponding data item $d_q$, are illustrated in an ordered sequence according to their precedence priority. Each of the ranges is depicted in the following form $R_q/d_q$ ($1 \leq q \leq n$), on the integer number axis numbered from 1 to n.

The Key K is searched simultaneously in each and every range $$R_1, R_2, R_3, R_4, \ldots, R_{i-1}, R_i, R_{i+1}, R_{i+2}, \ldots, R_{n-3}, R_{n-2}, R_{n-1}, R_n.$$

Each range, $R_q$, has its unique data item associated with $d_q$ (illustrated by $R_q/d_q$). For each Range $R_q$ (q is an integer, $1 \leq q \leq n$) a test is performed, which determines whether $K \in R_q$, or $K \notin R_q$. If it is determined that $K \in R_q$, then the result of this test is $m_q$="1" and the index q is now utilized to select $d_q$, which is $R_q$'s—Associated Data. The variable $m_q$ is a Boolean value which indicates a Match on $R_q$. such that $m_q$="1" indicates a Match ($K \in R_q$), and $m_q$="0" indicates that $K \notin R_q$, and that there is no meaning to the value of $d_q$.

This process is performed on each and every range, from the set of ordered ranges $R_1, R_2, R_3, R_4, \ldots, R_{i-1}, R_i, R_{i+1}, R_{i+2}, \ldots, R_{n-3}, R_{n-2}, R_{n-1}, R_n$ (where $1<2<3<4< \ldots <i-1<i<i+1<i+2< \ldots <n-3<n-2<n-1<n$), such that the result of the highest priority match (i.e., the range to which there is a match having smallest index) is then selected to retrieve the corresponding Associated Data. In the particular case of FIG. 2, a match is detected ($m_q$="1") for q=i,n−3, and n ($K \in R_i, R_{n-3}, R_n$). However, the highest priority match is the match with the range $R_i$ (i<n−3<n). Therefore, m="1", and $d=d_i$.

This process of Associated Data acquisition is similar to the way it is done in a Ternary CAMs (As described in a White Paper, "High Performance Layer 3 Forwarding", of Netlogic Microsystems Inc, and in "Fully Parallel 30-MHz, 2.5 Mb CAM" by Farhad Shafai et al, IEEE JSSC Vol. 33 No. 11, November 1998, pp. 1690–1696). The searched Key, K, is first checked against all the ranges $R_q$, (q=1,2, . . . , n). Post-Processing is required to determine which one of the many possible corresponding Associated Data values is ought to be selected on the ranges' priority basis.

This straightforward approach results in a simple implementation in hardware. However, it has three drawbacks when implemented in hardware. These drawbacks are high power consumption, inefficient hardware implementation, and search performance, which varies with the number of priority rules.

There is, however, an alternative way which is based upon the combining of overlapping ranges prior to performing the search. The combination of the overlapping ranges and their conversion to equivalent non-overlapping ranges, prior to performing searches is called Pre-processing.

Pre-Processing in the broader sense has been suggested in the context of classification (for instance, "High-Speed Policy-Based Forwarding Using Efficient Multi-Dimensional Range Matching", by V. Lakshman, Dimitrios Stiliadis, SIGCOM 1998, pp. 203–214). But it has not been applied in the context of Classless Inter Domain Routing (CIDR), or in the context of Ranges.

As will be explained hereinafter, the basic concept behind the method of the invention is that overlapping ranges can be combined prior to performing search, on the basis of the Ranges priority. Thus, the original overlapping Range Set $\mathfrak{R}$, can be traded for an equivalent non-overlapping Range Set $\Pi \equiv \{\rho_1, \rho_2, \ldots, \rho_v\}$ which yields consistently the same Associated Data. In a similar fashion, as in the general case, non-overlapping set of ranges has an Associated Data Set, $\Delta \equiv \{\delta_1, \delta_2, \ldots \delta_v\}$.

This method requires pre-computation of a Non-overlapping Equivalent Range Set having the following features: For any $\rho_i$, and $\rho_j$ ($i \neq j$), there is no integer K, which simultaneously belongs to the two ranges. That is, $K \in \rho_i \rightarrow K \notin \rho_j$; $i \neq j$, so that K is found in a single non-overlapping range. Therefore the notion of priority in the context of Non-overlapping Equivalent Range Set becomes dispensable.

Non-overlapping Equivalent Range Set

The range sets, $\Pi$, and $\mathfrak{R}$, are said to be equivalent, if and only if for every integer K, the results of the association function $\aleph$ yield the same results, that is—$\aleph(\Pi, \Delta, K) \equiv \aleph(\mathfrak{R}, D, K)$ so that—$(d,m) = \aleph(\mathfrak{R}, D, K)$, and $(\delta, \mu) = \aleph(\Pi, \Delta, K)$ then obviously—$m = \mu$ and $d = \delta$.

The equivalent set of ranges $\Pi$ is defined as a Non-overlapping Equivalent Range Set of an Overlapping Range Set $\mathfrak{R}$. As will be explained hereinafter, the following observations hold:

For each $\mathfrak{R}$ and D pair (of a an Overlapping Range Set) there is a unique equivalent pair $\Pi$ and $\Delta$ (of a Non-overlapping Equivalent Range Set).

The number of Range elements in $\Pi$, $v$, is smaller than, or equal to, $n+1$ ($v \leq n+1$), where n is the number of ranges in $\mathfrak{R}$.

For each $\rho_p \in \Pi$ there is an $R_q \in \mathfrak{R}$, such that $\rho_p \subseteq R_q$.

According to a preferred embodiment of the invention the combination of two overlapping Ranges is performed as follows:

For any given pair of overlapping ranges, $R_a = [N_L^a, N_H^a)$ with an Associated Data $d_a$ ($R_a/d_a$), and $R_b = [N_L^b, N_H^b)$ with an Associated Data $d_b$ ($R_b/d_b$), where the priority of $R_a$ is higher than the priority of $R_b$ (b>a), there are the following possible combinations Case 1

$N_L^a \in R_b$ and $N_H^a \in R_b$

That is when $R_a$ is completely included in $R_b$ ($R_a \cap R_b = R_a$), and in this case (illustrated in FIG. 3b), since $R_a$ is the range with the higher priority, the combination of the overlapping ranges results in three non-overlapping (but adjacent) ranges $[N_L^b, N_L^a)/d^b$, $R_a/d_a$, and $[N_L^b, N_L^a)/d_b$. The high priority of $R_a$ and its being completely included in $R_b$, lead to splitting $R_b$ into two distinct ranges (notice that $R_a$ is actually left untouched), $[N_L^b, N_L^a)d_b$ and $[N_L^b, N_L^a)/d_b$, having the same associated data $d_b$.

Case 2 (Illustrated in FIG. 3c)

$N_L^a \notin R_b$ and $N_H^a \in R_b$

That is when $R_a$ is partially included in $R_b$ ($R_a \cap R_b = [N_L^b, N_H^a]$), and as before, since $R_a$ is more dominant (i.e., with the higher priority), it remains fully, while $R_b$ is truncated (from its left side) to yield the two non-overlapping ranges $R_a/d_a$ and $[N_H^a, N_H^b]/d_b$. The new range $[N_H^a, N_H^b]/d_b$ is a new incarnation of $R_b$, but one in which the lower boundary is adjusted in order to maintain the completeness of $R_a$ (i.e., the lower boundary of this new range is taken to be the upper boundary of range $R_a$, $N_H^a$).

Case 3 (Illustrated in FIG. 3d)

$N_L^a \in R_b$ and $N_H^a \notin R_b$

This is the case where $R_b$ is partially included in $R_a$ ($R_a \cap R_b = [N_L^a, N_H^b]$), and as in case 2, $R_a$ remains complete, while $R_b$ is adjusted (truncated from its right side), and the new non-overlapping ranges obtained are $[N_L^b, N_L^a]/d_b$ and $R_a/d_a$. In this case, however, adjustment of $R_b$ is carried out by changing its upper boundary to the value of the lower boundary of range $R_a$, $N_L^a$.

Case 4 (Illustrated in FIG. 3e)

$N_L^a \notin R_b$ and $N_H^a \notin R_b$

This is a case of overlapping where no one of the boundaries of $R_a$ is contained in $R_b$, meaning that $R_b$ is completely contained in $R_a$ ($R_a \cap R_b = R_b$). Because $R_b$ is of low priority it is completely vanished in this case. More particularly, a range with low priority as no existence within a range of higher priority, as in this case, so that the result of combining ranges the, $R_a$ and $R_b$, is $R_a/d_a$, i.e., a single range having the boundaries and the associated data of $R_a$. If the Ranges $R_a$ and $R_b$ are non-overlapping (as illustrated in FIG. 3a), they remain unchanged.

The operation of combining two ranges will be designated hereinafter utilizing this notation—$\cup$. For example, $R_a \cup R_b \equiv R_a/d_a, [N_H^a, N_H^b]/d_b$ if $N_L^a \notin R_b$ and $N_H^a \in R_b$ (case 2). It should be noted that this operation is also valid for non-overlapping ranges, and that if the ranges are non-overlapping the result is trivial, the non-overlapping ranges are left untouched. Thus, for non-overlapping ranges:

$R_a \cap R_b = \Phi \rightarrow R_a \cup R_b = \{R_a, R_b\}$ (where $\Phi$ is an empty Range, that is $K \notin \Phi$, for any integer K).

As follows from the observations hereinabove, since $R_a$ is higher in priority than $R_b$, the non-overlapping range result always contains the original $R_a$. while $R_b$ is always replaced by newly created Ranges (case 1, 2, and 3), or is completely eliminated (case 4). Additionally, if $R_a \cap R_b \neq \Phi$ and $R_b \not\subset R_a$ (i.e., cases 1, 2, or 3) the new boundaries $[N_L^b, N_L^a]/d_b$ and/or $[N_H^a, N_H^b]/d_b$ are created, and $R_a$ is left as is after the $R_a \cup R_b$ operation. The non-overlapping ranges $R_a$, $[N_L^b, N_L^a]/d_b$ and/or $[N_H^a, N^{Hb}]/d_b$ are of the same priority, since those ranges are non-overlapping, thus the search yields always a single result, so that there is no significance to priority.

It should be noted that the operation of combining overlapping ranges to obtain an equivalent set of non-overlapping ranges, "$\cup$", fulfills also the basic algebraic laws of Identity laws, $R \cup \Phi = R$;
Associative laws, $(R_a \cup R_b) \cup R_c = R_a \cup (R_b \cup R_c)$; and
Commutative laws, $R_a \cup R_b = R_b \cup R_a$.

The Range operations are distinct in the sense that in addition to the operand "$\cup$" result being dependent on value of the basic elements, it also modifies the range boundaries. The relative position of the boundary values on the integer number axis (their one-dimensional topological relation) determines, which of the results might hold. Over all, there are five possible different results, when two ranges are combined.

FIG. 3 demonstrates graphically the possible results of the "$\cup$" operation, performed on two Ranges. In FIG. 3. there are 5 distinct cases, FIG. 3(a) through FIG. 3(e), which describes different possibilities for range interaction. FIG. 3(a) illustrates non-overlapping of the ranges $R_a$ and $R_b$ ($R_a \cap R_b = \Phi$), and FIGS. 3(b) through 3(e) correspond to the 4 cases that were described before (cases 1, 2, 3, and 4). In the figures the original ranges $R_a$ and $R_b$ are depicted on the left-hand side of each drawing, and the result of the "$\cup$" operation in between the two ranges is depicted on the right-hand side of each drawing. For all the cases, $R_a$ assumes a higher priority than $R_b$ (that is a<b).

FIG. 3(a) demonstrates a case in which the "$\cup$" operation results in $R_a$ and $R_b$ being unmodified ($R_a \cap R_b = \Phi$). FIG. 3(e) illustrates case no. 4, hereinabove, wherein $R_b$ is completely contained in $R_a$ ($R_a \cap R_b = R_b$), and which results in $R_a$ being unmodified and $R_b$ being eliminated. In FIGS. 3(b), 3(c) and 3(d) $R_a$ stays unmodified (cases 1, 2 and 3 respectively), $R_b$ disappears, and one, or two ranges are created as a result from the "$\cup$" operation in between $R_a$ and $R_b$.

Adjacent Ranges

Two Non-overlapping Ranges $R_i$, and $R_{i+1}$ are said to be Adjacent Ranges, if they share one boundary, that is $N_H^i = N_L^{i+1}$. For example, in FIG. 3(b), according to this definition, the two non-overlapping ranges $[N_L^b, N_L^a]$ and $R_a$ are Adjacent Ranges, as they share the boundary $N_L^a$, which is the open bound of $[N_L^b, N_L^a)$, and a closed boundary of $R_a$. Similarly, in each of the cases presented in FIGS. 3(b), 3(c) and 3(d), Adjacent Ranges are obtained.

As will understood later, Adjacent Ranges are of great importance, since they potentially enable a compact way of representing ranges, which results in significant saving in storage space. It should be understood that in FIGS. 3(b), 3(c) and (d) the shared boundaries of the Adjacent Ranges are marked twice, once for being the open boundary of a left-hand Range, and once for being a closed boundary for the right-hand range.

A significant outcome of combining sets of overlapping ranges into equivalent sets of non-overlapping/adjacent ranges is that a much more efficient and economic representation of the new set of ranges may be easily obtained (i.e., the non-overlapping). Given the set of Adjacent Ranges $\mathfrak{R}^A \equiv \{[N_1, N_2), [N_2, N_3), \ldots, [N_{i-1}, N_i), [N_i, N_{i+1}), \ldots, [N_{q-1}, N_q), [N_q, N_{q+1})\}$ and its Associated Data Set $D^A = \{d_1, d_2, \ldots, d_{i-1}, d_i, \ldots, d_{q-1}, d_q\},$ a set of ranges which may be equivalently represented by the boundary integer set $\mathfrak{R}^A = [N_1, N_2, N_3, \ldots N_{-1}, N_i, N_{i+1}, \ldots, N_{q-1}, N_q, N_{q+1})$, where $N_1$, is the closed boundary of the leftmost Adjacent Range, and $N_{q+1}$ is the open boundary of the rightmost Adjacent Range, and $N_2, N_3, \ldots, N_{i-1}, N_i, N_{i+1}, \ldots, N_{q-1}, N_q$ are the shared boundaries of the Adjacent Ranges.

As implied from the here above definition $N_1<N_2<N_3<\ldots<N_{i-1}<N_i<\ldots<N_{q-1}<N_q<N_{q+1}$. Thus, the process of searching in $\Re_A$ for a Range $R_i$ to which the integer K belongs (i.e., a match, when $K \in R_i$), and obtaining the Associated Data $d_i$, is equivalent to finding the appropriate index i, such that $N_i \leq K < N_{i+1}$, and accordingly retrieving the Associated Data.

The hereinabove definition yields a compact Adjacent Range representation, since each of the shared boundaries (of adjacent ranges) is presented only once, instead of twice, as in the "conventional" Adjacent Range notation. More particularly, in the "conventional" Adjacent Range notation each of the shared boundaries of adjacent ranges is represented once as the left-handed Adjacent Range Open Boundary, and once as the right-handed Adjacent Range Closed Boundary.

For instance, the following notations are equivalent for the cases of equivalent non-overlapping set ranges illustrated in FIGS. 3(b), 3(c) and 3(d). For the case $R_a \cap R_b = R_a$ of FIG. 3(b)

$$\{[N_L^b, N_L^a), R_a, [N_H^a, N_H^b)\} \equiv [N_L^b, N_L^a, N_H^a, N_H^b),$$

for the case $R_a \cap R_b = [N_L^b, N_H^a)$ of FIG. 3(c)

$$\{R, [N_H^a, N_H^b)\} \equiv [N_L^a, N_H^a, N^{Hb}), \text{ and finally,}$$

for the case $$R_a \cap R_b = [N_L^a, N_H^b) \text{ of FIG. 3}(d) - \{[N_L^b, N_L^a), R_a\} \equiv [N_L^b, N_L^a, N_H^a).$$

In accordance with the foregoing, given two Overlapping Ranges $R_a$ and $R_b$, the equivalent set of non-overlapping ranges given by $\Re^A = R_a \cup R_b$ is an Adjacent Range Set, having the compact representation $[N_1^A, \ldots, N_n^A]$, wherein $2 \leq n \leq 4$. Thereby, a Non-overlapping Equivalent Range Set $\Pi$ and its Associated Data Set $\Delta$, may be obtained by utilizing the "$\cup$" operation a multiple number of times on the Overlapping Range Set $\Re$ and its Associated Data Set D; and applying the Commutative and Associative Laws (as described herein above) a multiple number of times until all the resulted ranges are non-overlapping.

By adopting these observations, an efficient representation of A Non-overlapping Equivalent Range Set $\Pi \equiv \{\Re_1^A, \Re_2^A, \ldots, \Re_s^A\}$ can be obtained by expressing said Non-overlapping Equivalent Range Set as a set $\Pi$ of Adjacent Range subsets with an Associated Data Set $\Delta$, that is $$\Pi = \{[\Gamma_1, \Gamma_2, \ldots, \Gamma_p, \Gamma_{p+1}), [\Gamma_{p+2}, \Gamma_{p+3}, \ldots, \Gamma_q, \Gamma_{q+1}), \ldots, [\Gamma_{s+1}, \Gamma_{s+2}, \ldots, \Gamma_{t+1})\} \text{ and}$$

$$\Delta = \{\{\delta_1, \delta_2, \ldots, \delta_p\}, \{\delta_{p+1}, \delta_{p+2}, \ldots, \delta_{q-1}\}, \ldots, \{\delta_{s+1-(w-1)}, \delta_{s+2-(w-1)}, \ldots, \delta_{t-(w-1)}\}\},$$

where $1, 2, \ldots, p, p+1, p+2, \ldots, s, s+1, s+2, \ldots, t$ are sequential integer indexes, and w is the group number of a group of adjacent Ranges. With this convention, w=1 for the group of adjacent ranges $[\Gamma_1, \Gamma_2, \ldots, \Gamma_{p+1})$ and w=2 for $[_{p+2}, \Gamma_{p+3}, \ldots, \Gamma_{q+1})$, and so on. Therefore, any Range $[\Gamma_i, \Gamma_{i+1})$, in an equivalent non-overlapping range set, is having an associated data $\delta_{i-(w-1)}$.

Therefore, for any given Overlapping Range Set $$\Re \equiv \{[N_{L1}, N_H^1), [N_L^2, N_H^2), \ldots, [N_L^n, N_H^n)\}$$

comprised from a set of ranges $R_i \equiv [N_L^i, N_H^i)$, and its Associated Data Set $D \equiv \{d_1, d_2, \ldots, d_n\}$ where $d_i$ is the Associated Data of $R_i$, and said sets are arranged in priority order, $1 \leq i \leq n$ (i is higher in priority than j if i<j, and $1 \leq j \leq n$), there is a Non-overlapping Equivalent Range Set $$\Pi = \{[\Gamma_1, \Gamma_2, \ldots, \Gamma_p, \Gamma_{p+1}), [\Gamma_{p+2}, \Gamma_{p+3}, \ldots, \Gamma_{q+1}), \ldots, [\Gamma_{s+1}, \Gamma_{s+2}, \ldots, \Gamma_t, \Gamma_{t+1})\}$$

and a corresponding Associated Data Set $$\Delta = \{\{\delta_1, \delta_2, \ldots, \delta_p\}, \{\delta_{p+1}, \delta_{p+2}, \ldots, \delta_{q-1}\}, \ldots, \{\delta_{s+1-(w-1)}, \delta_{s+2-(w-1)}, \ldots, \delta_{t-(w-1)}\}\}$$

where $\Gamma_i = N_L^j$, or $\Gamma_i = N_H^j$, and $\delta_h = d_k$ for $1 \leq h, i, j, k, w \leq n$.

It should be clear that if the number of elements in D equals to n, and if the number of elements in $\Delta$ is t−(w−1), then necessarily t−(w−1)$\leq$n.

Figure 4:
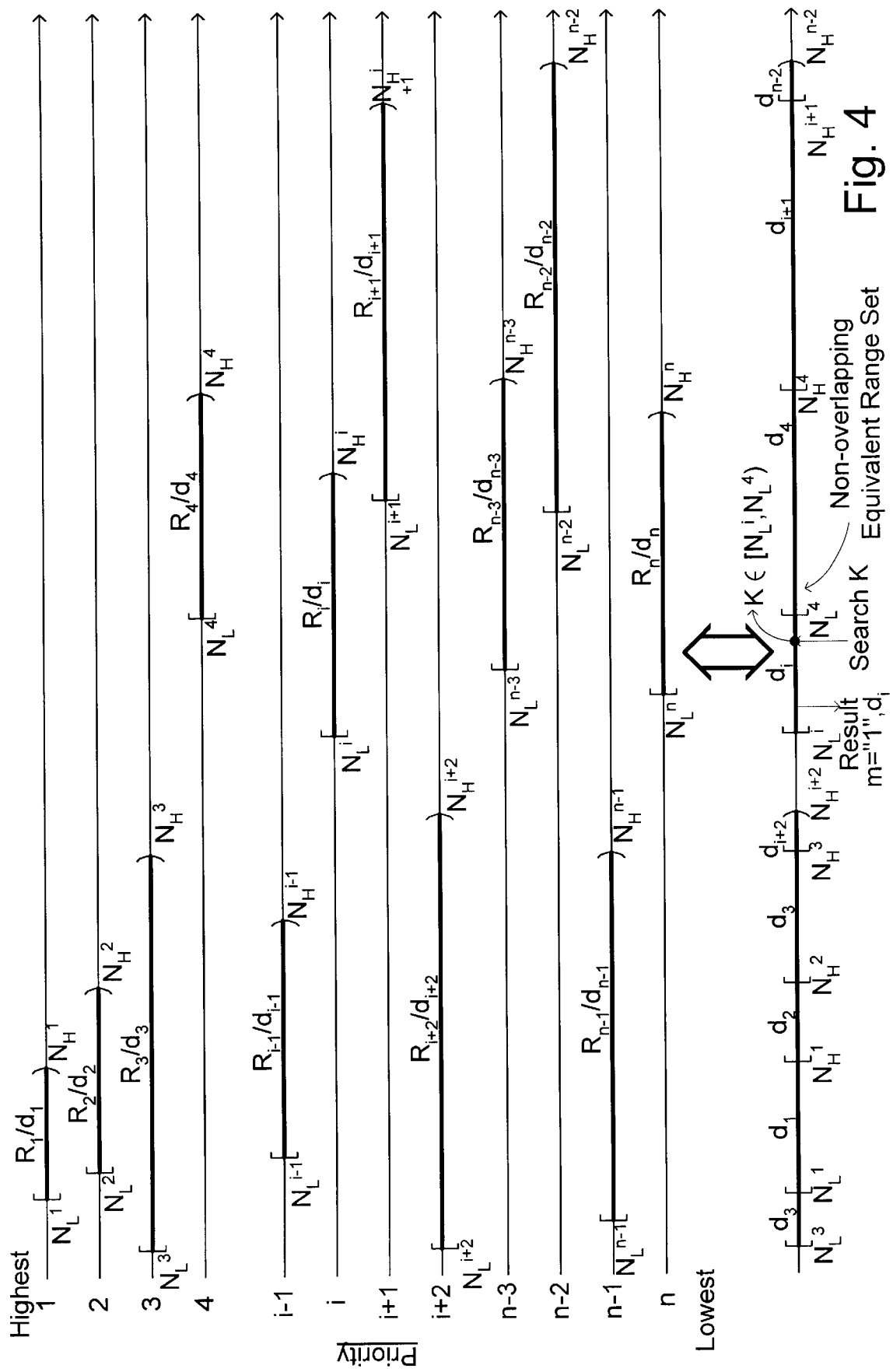
FIG. 4 graphically demonstrates the Non-overlapping Equivalent Range Set of the Overlapping Range Set illustrated FIG. 2.

FIG. 4 depicts the Non-overlapping Equivalent Range Set, which corresponds to the Overlapping Range Set depicted in FIG. 2. This Non-overlapping Equivalent Range Set results from utilizing the "$\cup$" operator and the Commutative and the Associative laws on the Overlapping Range Set (as was described hereinabove). The generation of Non-overlapping Equivalent Range Set assumes that either there are no additional Overlapping Ranges except for the depicted ones, or that all the additional overlapping ranges are contained in higher priority ranges.

Evidently, the number of boundary points in the Non-overlapping Equivalent Range is significantly smaller than the sum of all the boundaries of the depicted ranges. Additionally, each one of these boundary points belongs to one or more of the Overlapping Range boundaries.

Figure 5:
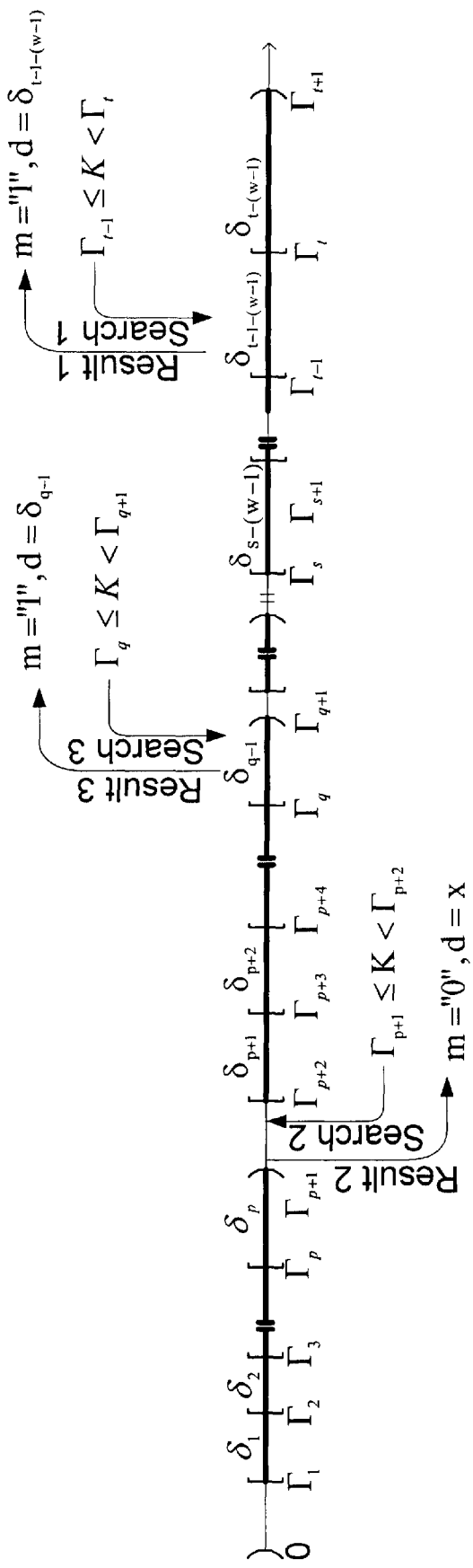
FIG. 5 graphically illustrates how a Key search is performed over a Non-overlapping Equivalent Range Set and its Associated Data.

FIG. 5 demonstrates how a Key search is performed over a Non-overlapping Equivalent Range Set and its Associated Data. Three different situations for a possible search are depicted:

1) the Key K falls into the interval $\Gamma_{t-1} \leq K < \Gamma_t$. In this case, since $\Gamma_{t-1}$ is a Closed Boundary, the proceeding boundary, $\Gamma_t$, is then the upper boundary of the Range $[\Gamma_{t-1}, \Gamma_t)$. The result of this search is m="1" (a Match), and as follows $d = \delta_{t-1-(w-1)}$. It should be noted that since $\delta_t$ is a Closed Boundary the interval to the right of $\Gamma_t$ is also a Range.

2) the Key K falls into the interval $\Gamma_{p+1} \leq K < \Gamma_{p+2}$. This time, the leftmost boundary $\Gamma_{p+1}$ is an Opened Boundary, and therefore the interval $)\Gamma_{p+1}, \Gamma_{p+2}[$ is not a Range. The result of this search is of course m="0" (a Mismatch), and as follows d=x (x stands for "don't care").

3) the Key K falls into the interval $\Gamma_q \leq K < \Gamma_{q+1}$, and since $\Gamma_q$ is a Closed Boundary, the next boundary $\Gamma_{q+1}$ therefore is an upper boundary of the range $[R_q, R_{q+1})$. The result of this search is then m="1" (a Match), and therefore $d = \delta_{q-1}$.

It should be noted that since $\Gamma_{q+1}$, is an Opened Boundary, the interval to the right of $\Gamma_{q+1}$ is not a Range. As seen in the three different situations presented herein above, a determination of whether the interval to which the Key K belongs is a range, is solely determined by the interval's left boundary. More particularly, if the left boundary is a Closed Boundary, then the interval is a Range, there is a Match ($m_{interval}$="1") and there is a meaningful Associated Data, $d_{interval}$, with this Range. If, however, the interval's left boundary is an Opened Boundary, then the interval is not a Range, so that there is a Mismatch ($m_{interval}$="0"), and there is no meaning to the Associated Data.

Since the notion of the leftmost boundary of an interval into which the Key falls is used to determine whether the interval is a range, a special care must be taken of the interval in between 0, and $\Gamma_1$. The boundary $\Gamma_1$ is the left boundary of the leftmost Range, $[\Gamma_1,\Gamma_2)$, if $\Gamma_1>0$. As a consequence, the integer "0" must be denoted as an Opened Boundary. This assures that searching for a Key in the interval $)0,\Gamma_1]$ will yield a Mismatch.

The Equivalent Non-overlapping Range Set representation described herein above reduces the number of enlisted boundary points as demonstrated in FIG. 5 (since each boundary point is represented only once). It also results in a unique match if there is one. Therefore, stored entry database is aggregated, and does not require performing multiple comparisons, and highest priority result selection.

RCAM Implementations

All the definitions and terms that are explained and illustrated hereinabove, are sufficient for understanding the concept and helpfulness of the RCAM scheme. In the following description, RCAM implementations are disclosed, according to preferred embodiments of the invention. The preferred embodiments of the invention consist of one implementation, which is based on a Post-Processing RCAM, and another implementation, based on a Pre-Processing RCAM.

Post-processing Based RCAM

Figure 6:
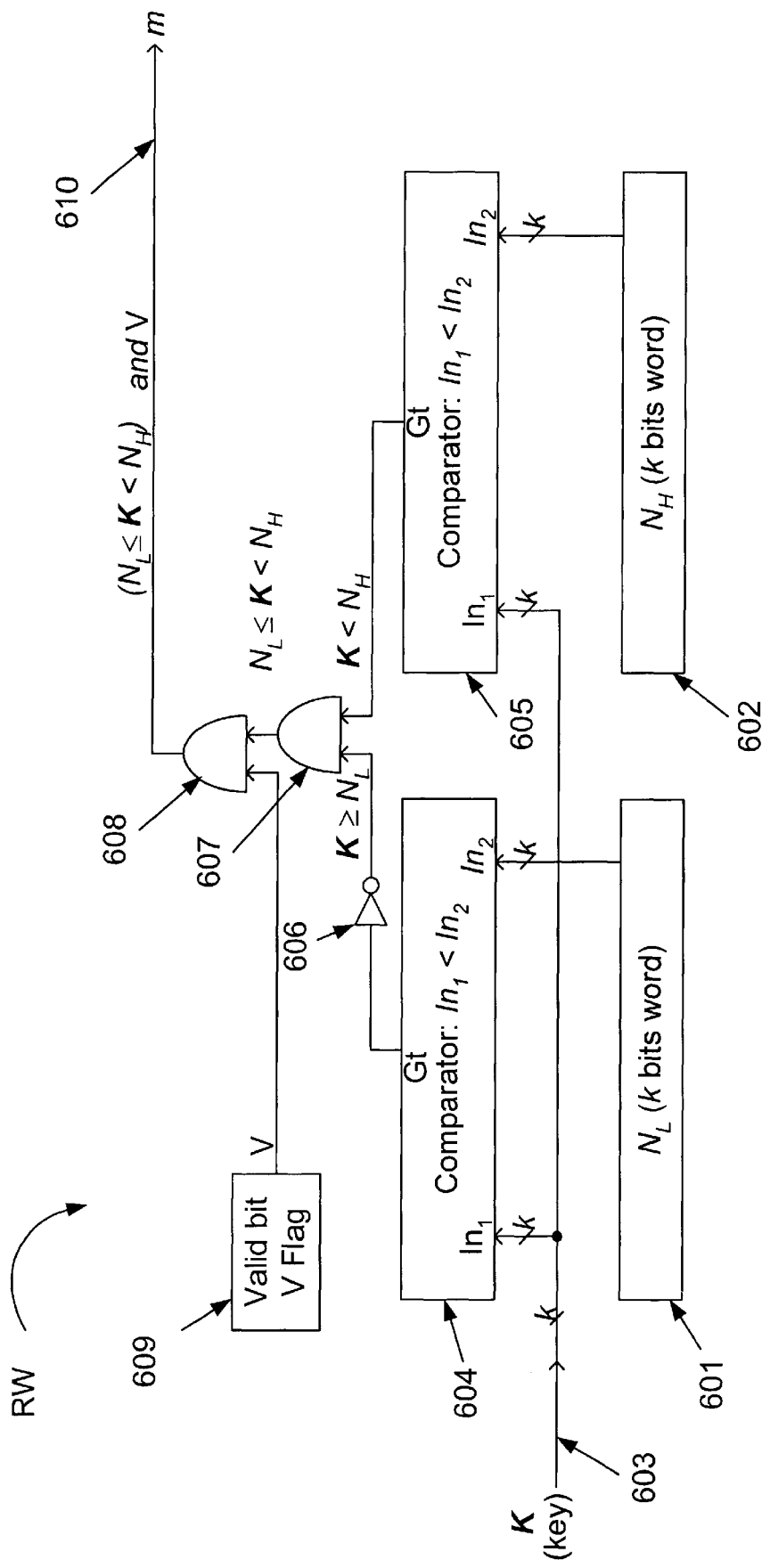
FIG. 6 schematically illustrates the RCAM's Range Word structure, key match detection, and generation of the match signal m according to a first embodiment of the invention.

This is a method in which the Overlapping of Ranges is allowed. FIG. 6 schematically illustrates the RCAM Range Word structure, key match detection, and generation of the match signal m 610. Each word contains 2 k bits of Range Data, which consists of the k-bit boundary $N_L$ 601, and the k-bit boundary $N_H$ 602. When Key search is performed, the value of the searched key is introduced on 603 (a k-bit integer). Two comparison operations are performed on the searched Key value 603, one with $N_L$ and the second with $N_H$, utilizing two separate "Greater than" (Gt) Comparators, 604 and 605 respectively. Each of the comparators, 604 and 605, has two inputs, $In_1$ and $In_2$, and one output Gt which produces a "True" signal (typically, logic "1") whenever $In_1<In_2$.

The Comparator 605 receives the value of the searched key K (on 603) on its In1 input and the value of $N_H$ (from 602) on its In2 input. Therefore, Comparator 605 produces on its Gt output a "True" signal, when $K<N_H$. Comparator 604 also receives the value of the searched key K (on 603) on its In1 input, but its In2 input is fed by the value of $N_H$ (from 602). Hence, a "True" value is produced on the Gt output of 604 whenever $K<N_L$. This result (of 604) should now be inverted to yield a "True" value whenever $K \geq N_L$, as required. Therefore, the inverter 606 is attached to the Gt output of the comparator 604, such that a "True" value is obtained on the output of 606 whenever $K \geq N_L$.

The AND gate 607 combines these results to yield a "True" value whenever $N_L \leq K < N_H$. This is obtained by connecting one of it inputs to the output of the inverter 606 (which is responsible for a $K \geq N_L$ indication), and connecting its other input to the Gt output of the comparator 605 (which the provides $K<N_H$ indication).

Issuing a Match indication (m="1") is dependent on whether the word is occupied with valid data (601 and 602). The V Flag bit 609 is set to indicate that the data word is valid (a data validation flag). If V="0" (the word does not contain valid data), there should be no Match (i.e., m="0"). For this task, another AND gate, 608, is utilized. By connecting one of the AND gate 608 inputs to the output of the AND gate 607, and its other input to the data validation flag, the V Flag 609, a "True" value is obtained on 610 whenever the conditions, $N_L \leq K < N_H$ and V="1", are satisfied.

Figure 7:
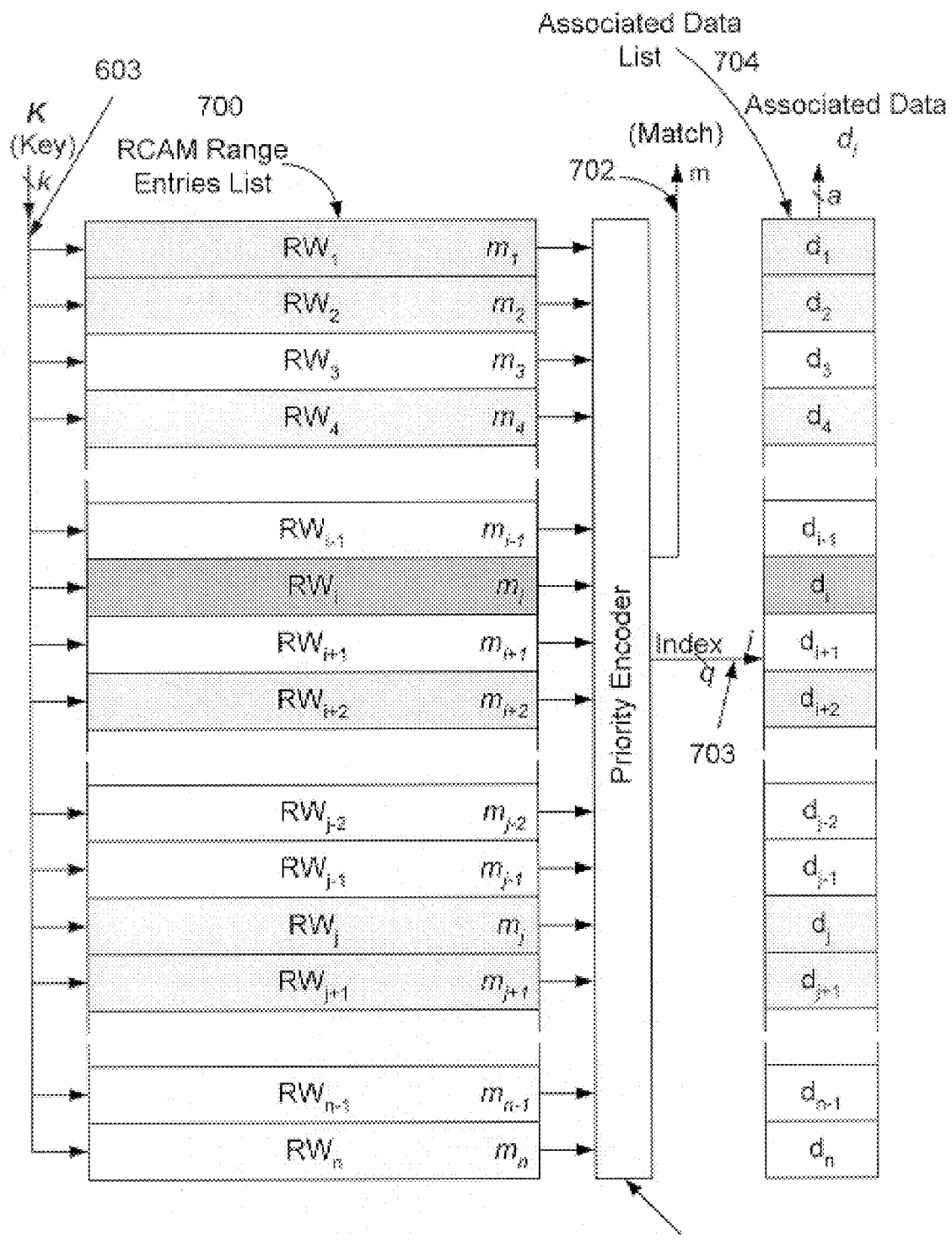
FIG. 7 schematically illustrates an RCAM comprised of an array of Range Words.

FIG. 7 schematically illustrates an RCAM, which incorporates an array of Range Words (RW), each of which may be constructed as illustrated in FIG. 6. The RCAM's entry list is comprised of the RWs $$RW_1, RW_2, RW_3, RW_4, \ldots, RW_{i-1}, RW_i, RW_{i+1}, RW_{i+2}, \ldots,$$
$$RW_{j-2}, RW_{j-1}, RW_j, RW_{j+1}, \ldots, RW_{n-1}, RW_n$$

The valid entries (having V="1") in FIG. 7 are shadowed, $RW_1, RW_2, RW_4, RW_i, RW_{i+2}, RW_j$ and $RW_{j+1}$, to indicate that they contain valid data. Whenever a k-bit Key K is submitted on 603 all the valid RWs for which the $N_L \leq K < N_H$ condition is satisfied, yields a $m_q$="1" value, where q is an integer, and $1 \leq q \leq n$. All the other WRs yield $m_q$="0".

The "$m_q$" outputs are driving a Priority Encoder 701. If i is the lowest index of $RW_i$, which generates $m_i$="1" (i.e. there is no $m_j$="1", such that $1 \leq j \leq i$), the Priority Encoder 701 outputs i at its Index output 703 (a q-bit output). This Index output serves as an address to the Associated Data memory 704, which incorporates the Associated Data List $$d_1, d_2, d_3, d_4 \ldots, d_{i-1}, d_i, d_{i+1}, d_{i+2}, \ldots, d_{j-2}, d_{j-1}, d_j, d_{j+1}, \ldots, d_{n-1}, d_n.$$

Therefore, proceeding with the example hereinabove, the Associated Data memory 704 receives the index i, from the Priority Encoder 701, on 703 and fetch its i'th word containing the Associated Data $d_i$, which is then provided on the a-bit output 705.

It should be noted that according to the preferred embodiment of the invention that the Associated Data may be embedded in the same device, or may be located in a separate device.

The match indication is provided on another output, 702, of the Priority Encoder 701. Additional logic inside the Priority Encoder 701 is utilized to calculate a Match, which is simply obtained by the computation of Match=$\cup_{i=1}^{n} m_i$ (may be implemented by performing the logic OR operation).

This is a simplified implementation, which is also very flexible, since there is no need for entry order. A new Range can be quickly inserted into any free (V="0") location, which is free below all the lower in priority Overlapping Ranges. A Range can be easily removed simply be resetting its Valid Flag. Additionally, this implementation does not require any Pre-Processing.

However, this implementation suffers from several disadvantages, which are associated with this approach (Post Processing):

First, since the Key may match multiple RWs, the comparisons must be performed on each and every RW. This results in significant power consumption, which is proportional to the number of comparators.

Second, the Priority Encoder's resolution time is proportional to the number of RWs. This time might be substantial for huge RCAMs, thus slowing down the RCAM performance. This effect can be reduced at a price of a more complicated Priority Encoder.

Third, the RW structure is bulky and space consuming. Therefore, it is not yielding to the implementation of RCAMs that are large in size.

Pre-Processing Based RCAM

In this embodiment of the invention, it is assumed that preprocessing is performed over the Overlapping Range Set of the RCAM device. This preprocessing results in a Non-overlapping Range Set. As will be described and illustrated herein the information related to the Non-overlapping Equivalent Range Set and its Associated Data, is stored in the RCAM device.

Figure 8:
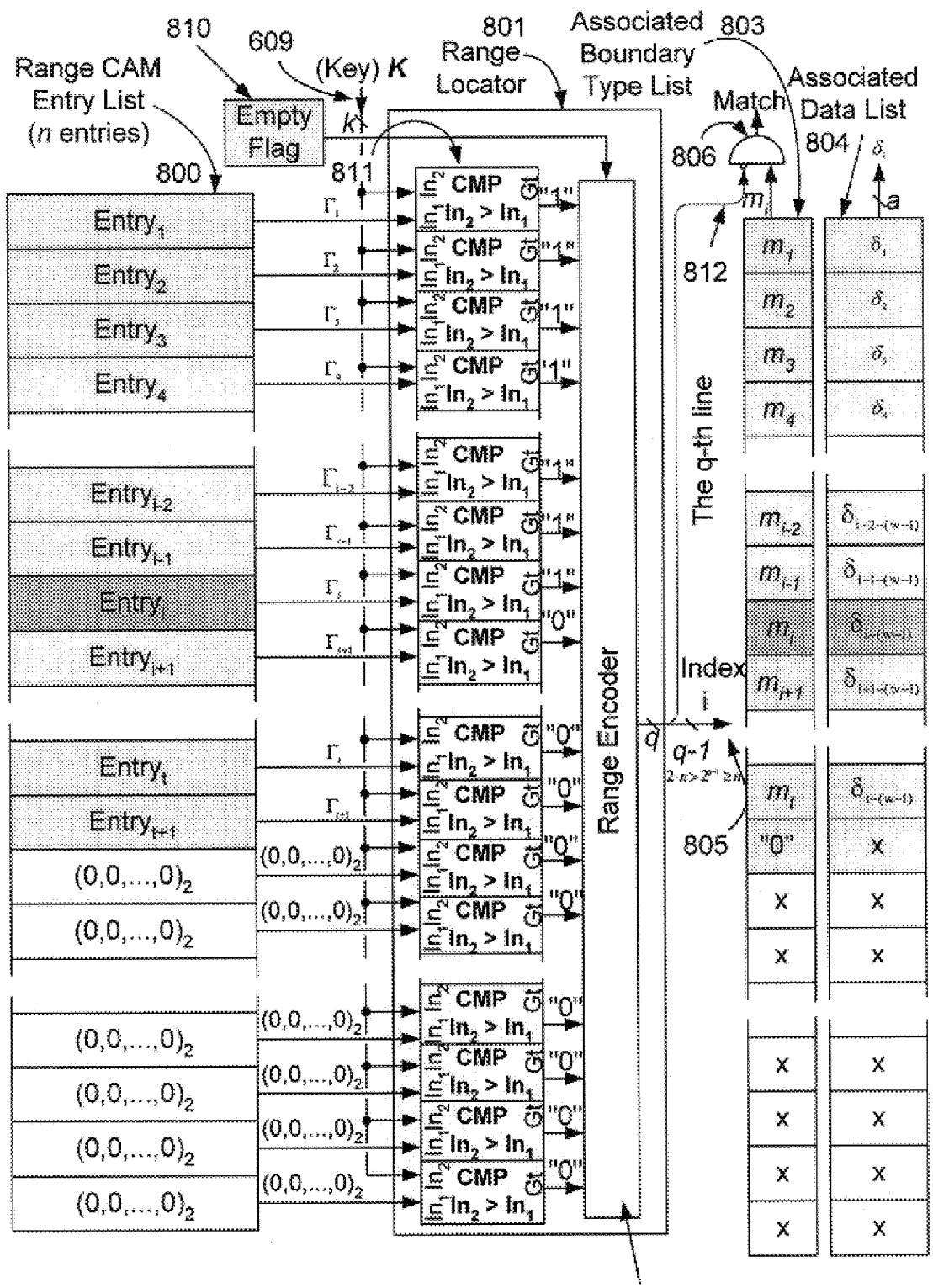
FIG. 8 schematically illustrates a preferred embodiment for a Pre-Processing Based RCAM according to the method of the invention.

FIG. 8 schematically illustrates a preferred embodiment for a Pre-Processing Based RCAM according to the method of the invention. In this embodiment, the Non-overlapping Equivalent Range Set boundaries are stored sequentially in the RCAM device. However, in this case gaps are not allowed to be present in between the stored boundaries. As a result, a contiguous storage space in the RCAM is occupied.

The entry list 800 of the Pre-Processing Based RCAM, which may comprise up to n entries, consists of the t+1 entries $Entry_1, Entry_2, Entry_3, Entry_4, \ldots, Entry_{i-2}, Entry_{i-1}, Entry_i, Entry_{i+1}, \ldots, Entry_t, Entry_{t+1}$, which are the valid entries of the RCAM (i.e., comprising range information). Following the valid entry block, $Entry_1, Entry_2, \ldots, Entry_{t+1}$, there is the invalid entry block, $Entry_{t+2}, \ldots, Entry_n$, wherein the entries are loaded with $(0,0, \ldots, 0)_2$ values, for reasons that will be explained later on.

Each of the entries, $Entry_1, Entry_2, \ldots, Entry_n$, in the Entry List 800, issues a boundary value $\Gamma_1, \Gamma_2, \ldots, \Gamma_n$, respectively. The boundaries issued by the invalid block, $\Gamma_{t+2}, \ldots, \Gamma_n$, are all of $(0,0, \ldots, 0)_2$ value, since these entries contain no valid boundaries. The boundary values $\Gamma_1, \Gamma_2, \ldots, \Gamma_n$ drive inputs of the Range Locator block 801. The entries in the valid block are arranged in an ordered manner, such that $$\Gamma_1 < \Gamma_2 < \Gamma_3 < \Gamma_4 < \ldots < \Gamma_{i-2} < \Gamma_{i-1} < \Gamma_i < \Gamma_{i+1} < \ldots < \Gamma_t < \Gamma_{t+1},$$

wherein $Entry_{t+1}$ is the last valid boundary entry.

The Range Locator 801 receives the $\Gamma_1, \Gamma_2, \ldots, \Gamma_n$ boundary values from each entry, and the Empty Flag 810, and generates an Index on 805, Index=i→1≤i≤n. The Empty Flag 810 is utilized to indicate that the Entry List is empty, which is the state in which it value is "1".

The invalid entries are loaded with $(0,0, \ldots, 0)_2$ values, which may be used only as the open lower boundary of the range with the highest priority, as it was explained herein before. Since in any other entry than $Entry_1$, $(0,0, \ldots, 0)_2$ is not a valid Entry, it is not interpreted as the k-bit $(0,0, \ldots, 0)_2$ value if it appears in any of the other entries $Entry_2, \ldots, Entry_n$. More precisely, the occurrence of the $(0,0, \ldots, 0)_2$ value in any of the entries $Entry_2, \ldots, Entry_n$ is now interpreted as the k+1 bit value $(1,0,0, \ldots, 0)_2$. The (k+1)th Silent "1" bit is generated inside all comparators in the Range Locator 801, except for the first Comparator 811, from $(0,0, \ldots, 0)_2$ k-bit Entry inside every comparator. This is now utilized to indicate an empty location for any location other than $Entry_1$. Since the k+1 bit value $(1,0,0, \ldots,)_2$ is greater than the k-bit value K, all the Comparators, except for the first Comparators 811, having Entries of $(0,0, \ldots, 0)_2$, issues Gt="0".

It should be clear that for $Entry_1$ $(0,0, \ldots, 0)_2$ indicates a true "0" if the Empty Flag 810 is not turned ON i.e., Empty="0" (meaning the Entry List 800 is not empty). Otherwise, if the Empty Flag 810 indicates that the Entry List 800 is empty i.e., Empty="1", the value of $Entry_1$ is interpreted as the k+1 bit value of $(1,0,0, \ldots, 0)_2$.

The Range Locator 801 comprises n Comparators, each of which compare the value of its respective entry, from which a boundary value $\Gamma_i$ (1≤i≤n) is obtained, with the value of the searched Key K on 609. With reference to FIG. 8, assuming that $\Gamma_i \leq K < \Gamma_{i+1}$, then since the boundaries are stored in an increasing order, for any p<i, K>$\Gamma_p$ and therefore the corresponding comparator's Gt output yields $Gt_p$="1".

On the other hand, for any i<p≤t, K<$\Gamma_p$ and therefore the corresponding comparators' Gt output yields $Gt_p$="0". Since the k+1bits value $(1,0,0, \ldots, 0)_2=2^k$>K, for any possible k-bit K value, the comparison of the two ($2^k$ and K) yields always "0" on the comparators' Gt output. (when a boundary value is "Greater than" a key K a "False" indication is obtained). Therefore, the proper interpretation of the value $(0,0, \ldots, 0)_2$ in entries $EntY_2, \ldots, Entry_n$ realizes the following condition, $2^k$>K, and thus the comparators' Gt output yields $Gt_p$="0" for (t+1)<p≤n.

The Gt outputs drives the inputs of the Range Encoder 802, which detects the transitional point i at which the Gt signals drop from "1" to "0". As it depicted in FIG. 8, and with accordance to the example above, this transition occurs between the i'th and the i+1 Gt outputs (since $\Gamma_i \leq K < \Gamma_{i+1}$). The Range Encoder 802 detects this transition, and issues a q-bit binary encoded Index signal, which carries the value of i, on 805.

Figure 9:
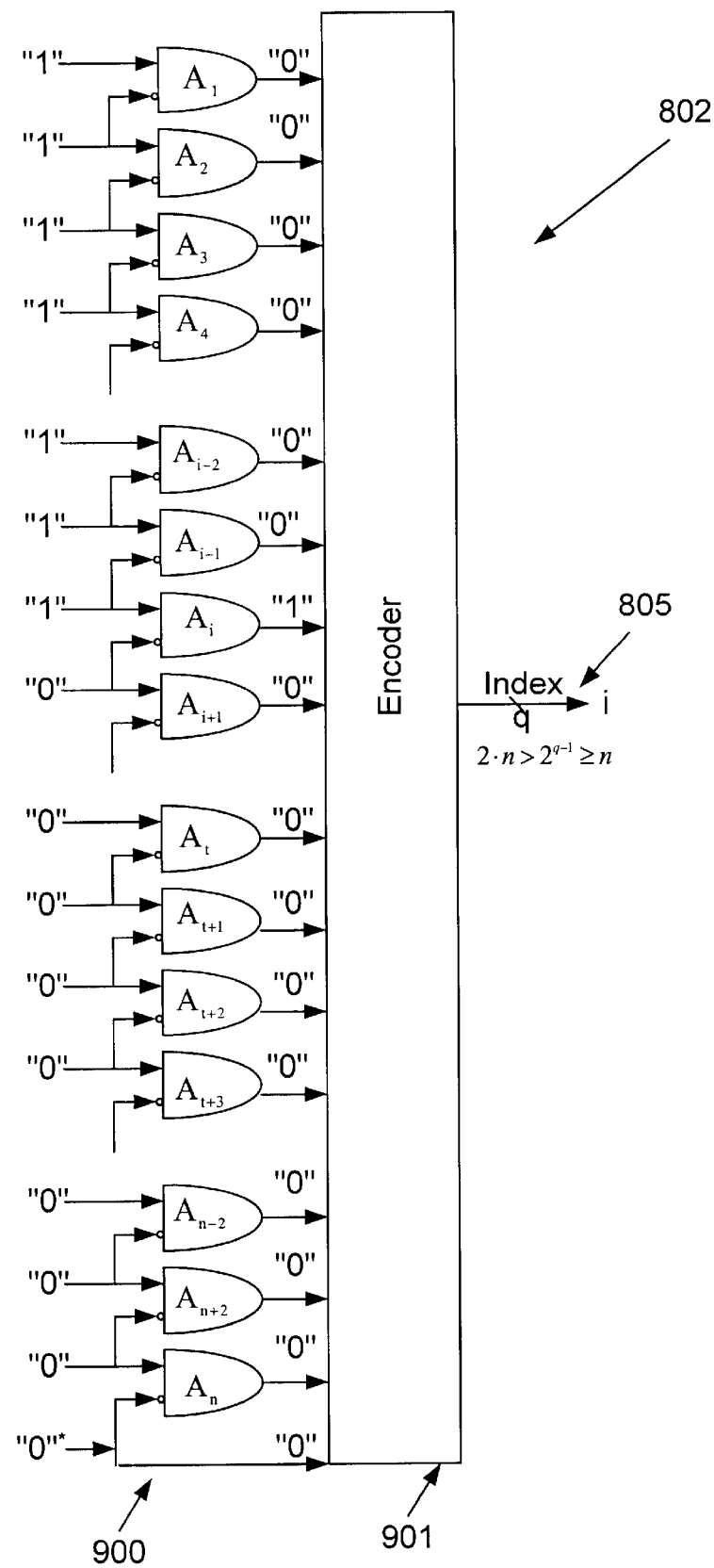
FIG. 9 schematically illustrates a possible embodiment of a Range Encoder, according to a preferred embodiment of the invention.

One possible embodiment of such a Range Encoder, according to a preferred embodiment of the invention, is depicted in FIG. 9. In this embodiment, transition detection logic 900, and a standard Encoder 901, are utilized. The transition detection logic 900 is comprised of an ordered set of n AND gates $A_1, A_2, A_3, A_4, \ldots, A_n$, each of which is receiving the corresponding Gt output of a comparator in one of it inputs. Such that the AND gate $A_i$ receives the Gt output of the comparator which compares the key K with the boundary value $\Gamma_i$.

The second input of each AND gate (the inverted input) receives the inverse value of the Gt output of the next comparator in order. Thus, the other input of $A_i$ receives the inverted result of the comparison of the searched key K with the value of the boundary $\Gamma_{i+1}$. As illustrated in FIG. 9, the output of each and every AND gate is "0", except for the i'th AND gate, $A_i$, and this precisely where the transition of the Gt outputs occurs.

The second input (the inverted input) of the last AND gate in the transition detection logic 900, $A_n$, receives a constant "0" value. This serves to produce the "Key is greater than any stored boundary" indication, when all of the Range Encoder's inputs set to "1", and thus the AND gate $A_n$ will detect a transition. This indication is utilized to enable/disable an output from the Boundary Type List 803, as will be explained herein after.

The Range Encoder output 805, is a q-bit wide bus, where $2 \cdot n > 2^{q-1} \geq n$. To access the Associated Data List 804 (depicted in FIG. 8) and the Associated Boundary Type List 803, the least significant q−1 lines of the data bus 805, are required. The q-th line is used for the special case for which all the Range Encoder's inputs are "1", That is when the Key K on 609 is greater than any stored boundary, including the n-th boundary. In this case the q-th line is set to "1" and a Match="0" is generated (indicating a mismatch) by the additional AND gate 806.

As is shown in FIG. 8, the AND gate 806 receives the inverted value of the q-th line 812 in one of its inputs and the resulting boundary type $m_i$, in its other input. The q-th line 812 is at "1" state when all the entries are smaller than K, and therefore all the comparators issue Gt="1". Thus, the value of the q-th line enables or disables the output of a Match indication. In all the other cases, where the value of the q-th line signal is "0" the resulting Match output is Match=$m_i$.

The Index is used as an address to the Associated Data List, and to the Associated Boundary List.

The Associated Boundary Type List 803 is 1-bit wide, and it comprises $m_p$ values.

$$m_p = \begin{cases} \text{"1"} & \text{if } \Gamma_p \text{ Closed - Boundary} \\ \text{"0"} & \text{if } \Gamma_p \text{ Opened - Boundary} \end{cases}$$

It should be noted that $m_{t+1}=$"0", since t+1 is the last boundary. For entries located after the last boundary, the m-bit value is don't care.

Thus, for instance, if $\Gamma_i \leq K < \Gamma_{i+1}$, which results in selection of the Index i, and assuming that $m_i=$"0" (i.e., $\Gamma_i$ is an Open Boundary), then there is a mismatch. On the other hand, if $m_i$"1" (i.e., $\Gamma_i$ is a Closed Boundary), there is a Match. Therefore the $m_i$ value can be utilized as the Match signal output.

The data associated with the Range $\Gamma_i \leq K < \Gamma_{i+1}$ ($\delta_{i-(w-1)}$) is fetched from the Associated Data List, that is the data stored in the i-th location, $\delta_{i-((w-1))}$. As was previously discussed, it should be clear that the Associated Data List may be stored on the same device, or may be stored on a different device than that of the RCAM Entry List 800.

The hereinabove RCAM structure requires Pre-Processing. The boundary entries must be stored in a sequential order. It requires half the number of storage bits, and half the number of comparators per entry. Therefore, it significantly reduces hardware costs, and improves storage and performance efficiency, more than the embodiment of the Post-Processing RCAM that was described hereinabove. Additionally, since the result resides always (if there is any) in the context of two entries (e.g., $\Gamma_i \leq K < \Gamma_{i+1}$) and two comparators only, therefore getting the Index is performed almost instantaneously, without any propagation as required for the Post-Processing RCAM.

Application of RCAM to Classless Inter Domain Routing (CIDR)

As was discussed earlier, the IPv4 (Internet Protocol Version 4, the currently used Internet version) addresses are of 32 bits. These 32-bit values are typically represented as four decimal values separated by a full stop, each representing an 8-bit binary number (octets). The IPv4-CIDR address is represented in the following form—A/p, wherein A is the IPv4 address, and p is the prefix, i.e., the number of contiguously compared most significant bits from left to right ($0 \leq p \leq 32$).

The prefix is equivalent to a 32-bit mask where the number of "1"s equals p, and where those p "1"s are followed by 32-p "0"s. The zeroed part of the mask (the part with the "0" values) indicates that this part of the address bits should be ignored, when comparing the value of a CIDR address with an address.

For example, given the IPDA 198.32.0.0, and its Mask 255.248.0.0, the IPv4-CIDR address representation is then, 198.32.0.0/13. In the binary notation the IP Address is 11000110 00100000 00000000 00000000 and the Mask 11111111 11111000 00000000 00000000

|← p = 13 →|

Since the 19 least significant bits are to be ignored, the 198.32.0.0/13 represents an Address Range, from 11000110 00100000 00000000 00000000=198.32.0.0

To 11000110 00100111 11111111 11111111=198.39.255.255

Using the Range representation, this is—[198.32.0.0, 198.40.0.0).

Thus, IPv4 CIDR addresses can be represented as Ranges, using the following formula—A/p≡[A, A+$2^{32-p}$). Where A≡a·$2^{32-p}$ and a is a p bit binary number (a=0 if p=0). In binary representation, if $0 < p \leq 32$ then a is the p-bit number $$a = (\alpha_{31}, \alpha_{30}, \ldots, \alpha_{32-p})_2$$

|← p – bits →| where $\alpha_i \in \{0,1\}$ for $0 \leq i \leq 31$. Thus, A/p≡[a·$2^{32-p}$, (a+1)·$2^{32-p}$).

Using this representation it can be concluded that each A/p IPv4 CIDR Address Range interval contains $2^{32-p}-1$ integers. It should be noted that IPv4 CIDR addresses are always convertible to Ranges. However this is not the case in the opposite direction (i.e., when converting any given Range into an IPv4 CIDR address). For example, the Range Representation of [198.171.0.0, 198.171.69.0), must be broken into the following three IPv4-CIDR addresses 198.171.0.0/18

198.171.64.0/22 and 198.171.68.0/24

Thus, the Range, according to the method of the invention, has an Aggregation Property of CIDR addresses, and by utilizing the method of the invention for range representation, a single Range may represent one or more IPv4 CIDR addresses.

It can be easily shown that any two IPv4 CIDR Address Ranges, $A_1/p$ and $A_2/p$, $A_1 \neq A_2$, having the same prefix p, are always Non-overlapping Ranges. Therefore, for any address A if $A \in A_1/p$ and $A_1 \neq A_2$, then essentially $A \notin A_2/p$, and vice versa.

In addition, for any range of IPv4 CIDR Overlapping Address Ranges, $A_1/p$ and $A_2/(p+1)$, essentially $A_2/(p+1) \subset A_1/p$, and if $A_1 \equiv (\alpha_{31}^1, \alpha_{30}^1, \ldots, \alpha_{32-p}^1)_2 \cdot 2^{32-p}$ and $A_2 \equiv (\alpha_{31}^2, \alpha_{30}^2, \ldots, \alpha_{32-p}^2, \alpha_{32-p-1}^2)_2 \cdot 2^{32-p-1}$, then $\alpha_i^2 \equiv \alpha_i^1$ for $(32-p) \leq i \leq 32$. Alternatively, this means that $A_1 \equiv A_2$, or $A_2 \equiv A_1 + 2^{32-p-1}$.

These observations are important since it means that any two IPv4 CIDR Overlapping Address Ranges that are having a prefix difference which equals 1, share either the lower bound, or the upper bound. Moreover, for any two IPv4 CIDR Overlapping Address Ranges, $A_1/p_1$ and $A_2/p_2$, where $p_1 > p_2$, essentially, $A_1/p_1 \subset A_2/p_2$ and $\alpha_i^1 \equiv \alpha_i^2$ for $32 \leq i \leq (32-p_1)$.

Figure 10:
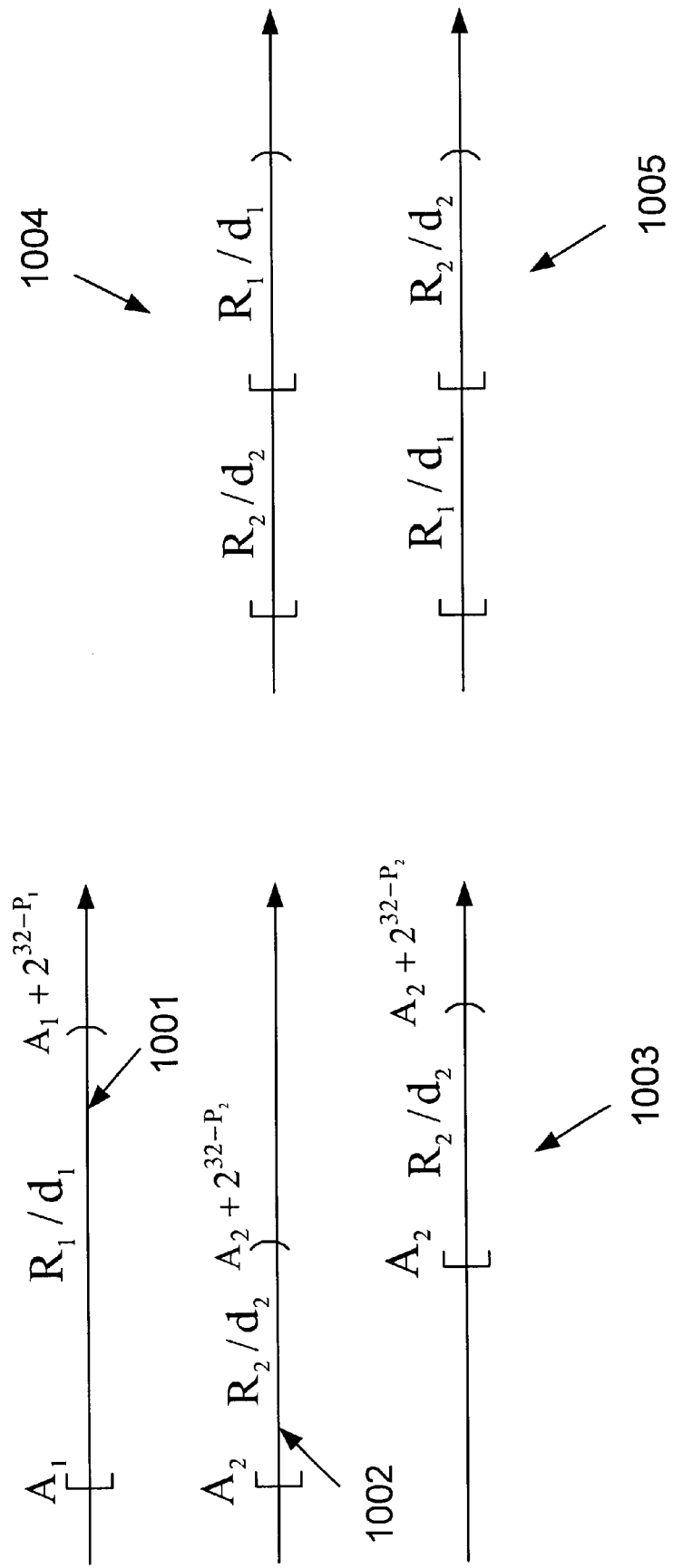
FIG. 10 schematically illustrates overlapping of IPv4 CIDR addresses.

The overlapping of IPv4 CIDR addresses is demonstrated in FIG. 10. The IPv4 CIDR address range $A_1/p_1$, 1001 ($R_1/d_1$), and $A_2/p_2$ ($R_2/d_2$), are an overlapping pair of ranges. In this example $p_2 = p_1+1$, and thus $A_1/p_i$ is a bigger range, and $A_2/P_2$ is a smaller range, then there may be one of two cases, as illustrated in FIG. 10. In one case, 1002, the ranges have the same CIDR addresses $A_1 = A_2$, while in the other case the CIDR addresses are different $A_1 \neq A_2$, 1003. For example, let assume that the first range $A_1/p_1$ 1001 is the range 100.100.0.0/16 ($p_1=16$), then the other range $A_2/p_2$ ($p_2=17$) may be 100.100.0.0/17 as depicted by 1002, or otherwise it may be 100.100.128.0/17, as depicted by 1003.

FIG. 10 also illustrates the Equivalent non-Overlapping Range Set for each case. In both of the cases, 1004 and 1005, two adjacent non-overlapping range sets are obtained. Keeping in mind that $A_2/p_2$ is the range with the longer prefix (and thus with higher priority), then in the first case, 1004, $A_2/p_2$ remains untouched while from $A_1/p_1$ only the right-hand side half is remained. Similarly, in the second case, 1005, $A_2/P_2$ remains untouched while from $A_1/p_1$ only the left-hand side half is remained.

When utilizing the CIDR convention, if an Address A matches one or more IPv4 CIDR Address Ranges, then the Associated Data with the one with the Longest Prefix Match is selected. That is, if $A \in A_1/p_1$ and $A \in A_2/p_2$, where $p_2 > p_1$, and $d_1$ and d2 are the respective Associated Data, then $d_2$ is selected. Therefore, IPv4 CIDR Address Range priorities can be assigned in the order of their prefix length, that is the longer the prefix, the higher the priority.

Hence, the IPv4 CIDR Address Ranges are assigned one of 32 possible priorities, such that there can be different IPv4 CIDR Address Ranges, which are assigned the same priority (or have the same prefix length). This is however of no consequence, as it was previously explained herein, IPv4 CIDR Address Ranges having the same prefix value, are always non-overlapping.

In RCAM implementations, each IPv4 CIDR address must be converted to a Range, using the formula $A/p \equiv [A, A+2^{32-P})$ where $A \equiv a \cdot 2^{32-P}$, as it was described herein before. Any further steps are dependent on whether the Post-Processing, or the Pre-Processing method is used.

In the Post-Processing implementations, depicted in FIG. 7, the IPv4 CIDR Address Range entries are ordered according to their prefix-length (which reflects their priority), first, the ones with a prefix-length of 32, followed by those with a prefix-length of 31, and of 30, . . . , and finally with those with prefix-length of 0 at the bottom. The Zero prefix-length is defined as a Default Search Result, and it applies if no higher in priority Match exists, and therefore only a single zero prefix length entry is meaningful.

In Pre-Processing implementations, depicted in FIG. 8, it is first required to convert the IPv4 CIDR Overlapping Address Range Set into a non-overlapping Equivalent Range Set, according with the principles presented herein before. The conversion results in a list of opened and closed boundaries that are entered in their size order into the RCAM Entry List 800 of FIG. 8.

The respective notions of Closed or Opened Boundary are stored under the same Index in the Associated Boundary Type List 803, and the respective Associated Data values are stored in the Associated Data List 804. All unoccupied entries in the RCAM's Entry List are loaded with $(0,0, \ldots, 0)_2$ values as was previously explained herein.

According to tests performed on the Pre-processing RCAM implementation, wherein huge databases (incorporating ten of thousands of entries), a consistent reduction in the number of boundaries, of approximately 35%, was observed. This represents a major saving in comparison to the original database.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A method for arranging and storing, in a memory, an associative key data set of associative elements and a corresponding associated data set of associated elements, wherein each associative element represents a range of consecutive values, such that an associated element may be extracted from said memory as valid data if an input key belongs to at least one of the associative elements, said range being represented by at least one of a lower boundary value and an upper boundary value associated with said range, the method comprising:

a) providing at least one memory device including a first storage area for storing said associative key data set and a second storage area for storing said associated data set, such that for each storage location in said first storage area there is a corresponding storage location in said second storage area;
   b) arranging the associative elements of said associative key data set and their corresponding associated data set in an order determined by a priority precedence;
   c) assigning a unique index for each associative element, representing an ordered location thereof;
   d) storing at least one boundary value of each associative element in said first storage area in a location that corresponds to said order, and
   e) storing each value of said associated data set in a location in said second storage area corresponding to the location of the associative element to which it is associated.

2. The method according to claim 1, wherein each associative element of the associative elements of the key association data set is a ranges of consecutive values having semi-open/semi-closed boundaries.

3. The method according to claim 2, wherein said range has a closed boundary as a lower boundary thereof, and an open boundary as an upper boundary thereof.

4. The method according to claim 3, wherein values of said lower boundary and said upper boundary of said range are determined by k bits in a binary representation, and any value that is larger than all values contained in said range is represented by said open upper boundary consisting of k consecutive "0" bits, so as to imply an existence of a leftmost n-lost significant $(k+1)^{th}$ bit "1", said most significant bit being omitted in said representation.

5. The method according to claim 2, wherein said range has a closed boundary as an upper boundary thereof, and an open boundary as a lower boundary thereof.

6. The method according to claim 1, wherein the ranges that correspond to different associative elements include non-overlapping ranges.

7. The method according to claim 1, wherein the range represents a group of consecutive Classless Inter Domain Routing (CIDR) addresses.

8. The method according to claim 1, wherein whenever ranges that correspond to different associative elements are overlapping ranges, seeking a match between an input key and a range by performing the following steps:

i) arranging said ranges in their priority precedence order;
   ii) comparing said input key with the values within each range, and obtaining one or more match indications whenever said input key belongs to one or more ranges, and
   iii) selecting the match indication corresponding to the range having the highest priority.

9. The method according to claim 1, further comprising the step of:

(f) conducting a key search on the associative key data set, upon receiving the input key.

10. The method according to claim 9, further comprising the step of:

(g) extracting an associated data value from said associated data set, based on said key search.

11. The method according to claim 10, further comprising the step of:

(h) if no match between said input key and the associative key data set is found, outputting a no-match signal indicating that said associated data value from step (g) is invalid.

12. The method according to claim 10, further comprising the step of:
   (h) if a match between said input key and the associative key data set is found, outputting a match signal indicating that said associated data value from step (g) is valid.

13. The method according to claim 9, further comprising the step of:
   (g) if a plurality of matches between said input key and matching associative elements within the associative key data set is found, outputting a value of said associated data set corresponding to a matching associative element having a highest priority among said matching associative elements.

14. The method according to claim 1, wherein associative elements having a higher priority are placed before associative elements having a lower priority.

15. An apparatus for arranging and storing, in a memory, an associative key data set of associative elements and a corresponding associated data set of associated elements, wherein each associative element represents a range of consecutive values, such that an associated element may be extracted from the memory as valid data if an input key belongs to at least one of the associative elements, the range being represented by at least one of a lower boundary value and an upper boundary value associated with the range, the apparatus comprising:
   at least one memory device including:
      i) a first storage area for storing said associative key data set, and
      ii) a second storage area for storing said associated data set, such that for each storage location in said first storage area there is a corresponding storage location in said second storage area;
   wherein the associative elements of the associative key data set are arranged in an order determined by a priority precedence,
   and wherein at least one boundary value of each associative element is stored in said first storage area in a location that corresponds to said order,
   and wherein each value of said associated data set is stored in said corresponding storage location in said second storage area.

16. The apparatus of claim 15, wherein each of the associative elements includes a range of consecutive values.

17. The apparatus of claim 16, wherein said range of consecutive values has a closed boundary and an open boundary.

18. The apparatus of claim 17, wherein values of said lower boundary and said upper boundary of said range are determined by k bits in a binary representation, and any value that is larger than all values contained in said range is represented by said open upper boundary consisting of k consecutive "0" bits, so as to imply an existence of a leftmost most significant $(k+1)^{th}$ bit "1", said most significant bit being omitted in said representation.

19. The apparatus of claim 15, further comprising:
   circuitry for seeking, upon receiving a particular input key, at least one said associative element having a range of values that may contain said particular input key.

20. The apparatus of claim 15, further comprising:
   circuitry for outputting associated data corresponding to the associative element having the highest priority of all associative elements containing a particular input key.

21. The apparatus of claim 15, further comprising:
   circuitry for outputting a no-match signal indicating that associated data being output is invalid, if a particular input key is outside all ranges of the associative key data set.

22. The apparatus of claim 15, further comprising:
   circuitry for outputting a match signal indicating that associated data being output is valid, if a particular input key is contained in an associative element belonging to the associative key data set.

23. The method according to claim 15, wherein the range represents a group of consecutive Classless Inter Domain Routing (CIDR) addresses.

24. A method for arranging and storing, in a memory, an associative key data set of associative elements and a corresponding associated data set of associated elements, wherein each associative element represents a range of consecutive values, such that an associated element may be extracted from the memory as valid data if an input key belongs to one of the associative elements, the range being represented by at least one of a lower boundary value and an upper boundary value associated with the range, the method comprising:
   a) providing at least one memory device including a first storage area for storing said associative key data set and a second storage area for storing said associated data set, such that for each storage location in said first storage area there is a corresponding storage location in said second storage area;
   b) arranging at least one boundary value of each associative element in said first storage area in a pre-determined order, such that each successive range is arranged in a monotonic order with respect to a previous range;
   c) assigning a unique index for each associative element, and
   d) storing each value of said associated data set in said corresponding storage location in said second storage area.

25. The method of claim 24, wherein each of the associative elements includes a range of consecutive values.

26. The method of claim 25, wherein said range of consecutive values has a closed boundary and an open boundary.

27. The method according to claim 26, wherein values of said lower boundary and said upper boundary of said range of consecutive values are determined by k bits in a binary representation, and any value that is larger than all values contained in said range is represented by said open upper boundary consisting of k consecutive "0" bits, so as to imply an existence of a leftmost most significant $(k+1)^{th}$ bit "1", said most significant bit being omitted in said representation.

28. The method according to claim 26, wherein said range of consecutive values represents a group of consecutive Classless Inter Domain Routing (CIDR) addresses.

29. The method according to claim 24, further comprising the step of:
   e) determining whether the input key belongs to an associative element of the associative elements.

30. The method according to claim 24, further comprising the step of:
   e) processing the associative elements according to a pre-determined priority criterion, so as to convert the ranges of the associative elements to non-overlapping ranges.

31. The method according to claim 30, wherein said processing includes truncating any overlapping portions from those ranges having lower priority, while maintaining with no change, for each set of overlapping portions, a single portion having the highest priority within said set of overlapping portions, so as to obtain an equivalent set of non-overlapping ranges.

32. A method for arranging and storing, in a memory, an associative key data set of associative elements and a corresponding associated data set of associated elements, wherein each associative element represents a range of consecutive values, such that an associated element may be extracted from said memory as valid data if an input key belongs to one of the associative elements, said range being represented by at least one of a lower boundary value and an upper boundary value associated with the range, the method comprising:

a) providing at least one memory device including a first storage area for storing said associative key data set and a second storage area for storing said associated data set, such that for each storage location in said first storage area there is a corresponding storage location in said second storage area,
   wherein each of the associative elements of the associative key data set includes a range of consecutive values;

b) representing said range of consecutive values within said first storage area as at least one of a lower boundary value and an upper boundary value associated with the range, wherein at least one value of said values is selected from the group consisting of a closed boundary value and an open boundary value;

c) assigning a unique index for each associative element, and d) storing each value of said associated data set in said corresponding storage location in said second storage area.

33. The method according to claim 32, further comprising the step of:

e) processing the associative elements according to a pre-determined priority criterion, so as to convert the ranges of the associative elements to non-overlapping ranges.

34. The method according to claim 33, wherein said processing is performed prior to step d).

35. The method according to claim 32, further comprising the step of:

e) arranging at least one boundary value of each associative element in said first storage area in a pre-determined order, such that each successive range is arranged in a monotonic order with respect to a previous range.

36. The method according to claim 32, wherein said range of consecutive values represents a group of consecutive Classless Inter Domain Routing (CIDR) addresses.

37. The method according to claim 32, wherein values of said lower boundary and said upper boundary of said range are determined by k bits in a binary representation, and any value that is larger than all values contained in said range is represented by said open upper boundary consisting of k consecutive "0" bits, so as to imply an existence of a leftmost most significant $(k+1)^{th}$ bit "1", said most significant bit being omitted in said representation.

38. A method for arranging and storing, in a memory, an associative key data set of associative elements and a corresponding associated data set of associated elements, wherein each associative element represents a range of consecutive values, such that an associated element may be extracted from the memory as valid data if an input key belongs to one of the associative elements, the range being represented by at least one of a lower boundary value and an upper boundary value associated with the range, the method comprising:

a) providing at least one memory device including a first storage area for storing said associative key data set and a second storage area for storing said associated data set, such that for each storage location in said first storage area there is a corresponding storage location in said second storage area;

b) eliminating overlapping of the ranges, according to at least one pre-determined priority criterion, so as to produce a set of non-overlapping ranges;

c) storing said set of non-overlapping ranges within said first storage area as said associative key data set of associative elements, said key data set including at least one boundary value of each associative element, and d) storing each value of said associated data set in said corresponding storage location in said second storage area.

39. The method according to claim 38, wherein said processing is performed prior to step d).

40. The method according to claim 38, further comprising the step of:

e) arranging at least one boundary value of each associative element in said first storage area in a pre-determined order, such that each successive range is arranged in a monotonic order with respect to a previous range.

41. The method according to claim 38, wherein the range of consecutive values represents a group of consecutive Classless Inter Domain Routing (CIDR) addresses.

42. The method according to claim 38, wherein values of the lower boundary and the upper boundary of the range are determined by k bits in a binary representation, and any value that is larger than all values contained in the range is represented by the open upper boundary consisting of k consecutive "0" bits, so as to imply an existence of a leftmost most significant $(k+1)^{th}$ bit "1", said most significant bit being omitted in said representation.

* * * * *